(12) United States Patent
Zhang et al.

(10) Patent No.: US 9,184,344 B2
(45) Date of Patent: Nov. 10, 2015

(54) LIGHTING-EMITTING DEVICE WITH NANOSTRUCTURED LAYER AND METHOD FOR FABRICATING THE SAME

(75) Inventors: Jianping Zhang, El Monte, CA (US); Hongmei Wang, El Monte, CA (US); Chunhui Yan, El Monte, CA (US); Wen Wang, El Monte, CA (US); Ying Liu, El Monte, CA (US)

(73) Assignee: INVENLUX LIMITED, Central (HK)

( * ) Notice: Subject to any disclaimer, the term of this patent is extended or adjusted under 35 U.S.C. 154(b) by 340 days.

(21) Appl. No.: 13/358,438

(22) Filed: Jan. 25, 2012

(65) Prior Publication Data

US 2013/0187124 A1 Jul. 25, 2013

(51) Int. Cl.
| | |
|---|---|
| *H01L 33/32* | (2010.01) |
| *H01L 33/16* | (2010.01) |
| *B82Y 20/00* | (2011.01) |
| *B82Y 40/00* | (2011.01) |

(52) U.S. Cl.
CPC .................. *H01L 33/16* (2013.01); *B82Y 20/00* (2013.01); *B82Y 40/00* (2013.01); *H01L 33/32* (2013.01)

(58) Field of Classification Search
CPC .......... H01L 33/32; H01L 33/22; H01L 33/12
USPC ................................................ 257/79, 91–98
See application file for complete search history.

(56) References Cited

U.S. PATENT DOCUMENTS

| | | | |
|---|---|---|---|
| 6,329,667 B1 | 12/2001 | Ota et al. | |
| 6,630,692 B2 | 10/2003 | Goetz et al. | |
| 6,693,303 B2 | 2/2004 | Ota et al. | |
| 7,026,653 B2 | 4/2006 | Sun | |
| 7,355,210 B2 * | 4/2008 | Ou et al. | 257/95 |
| 7,547,908 B2 | 6/2009 | Grillot et al. | |
| 7,611,917 B2 | 11/2009 | Emerson et al. | |
| 7,663,148 B2 | 2/2010 | Yi et al. | |
| 7,888,696 B2 * | 2/2011 | Kang | 257/98 |
| 7,989,832 B2 * | 8/2011 | Kim | 257/98 |
| 2007/0228395 A1 * | 10/2007 | Kamiyama et al. | 257/79 |
| 2008/0099781 A1 | 5/2008 | Choi et al. | 257/103 |
| 2010/0301381 A1 * | 12/2010 | Urata | 257/103 |
| 2011/0318860 A1 * | 12/2011 | Chen et al. | 438/47 |

FOREIGN PATENT DOCUMENTS

| | | |
|---|---|---|
| JP | 2005-235989 A | 9/2005 |
| KR | 10-2010-059499 A | 6/2010 |
| KR | 10-2010-0102837 A | 9/2010 |
| KR | 10-2011-0105644 A | 9/2011 |

OTHER PUBLICATIONS

Yukio Narukawa et al., "White light emitting diodes with super-high luminous efficacy" Journal of Physics D: Applied Physics; vol. 43, (2010); 354002.

International Search Report of corresponding International PCT Application No. PCT/US2013/022978 dated May 13, 2013.

* cited by examiner

*Primary Examiner* — David Vu
*Assistant Examiner* — Jonathan Han
(74) *Attorney, Agent, or Firm* — J. C. Patents

(57) ABSTRACT

A light emitting device has a nanostructured layer with nanovoids. The nanostructured layer can be provided below and adjacent to active region or on a substrate or a template below an n-type layer for the active region, so as to reduce strain between epitaxial layers in the light emitting device. A method of manufacturing the same is provided.

27 Claims, 19 Drawing Sheets

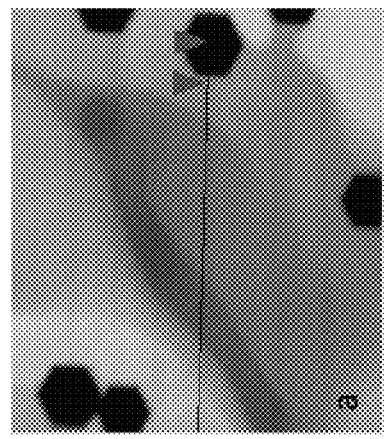
FIG. 7D-a
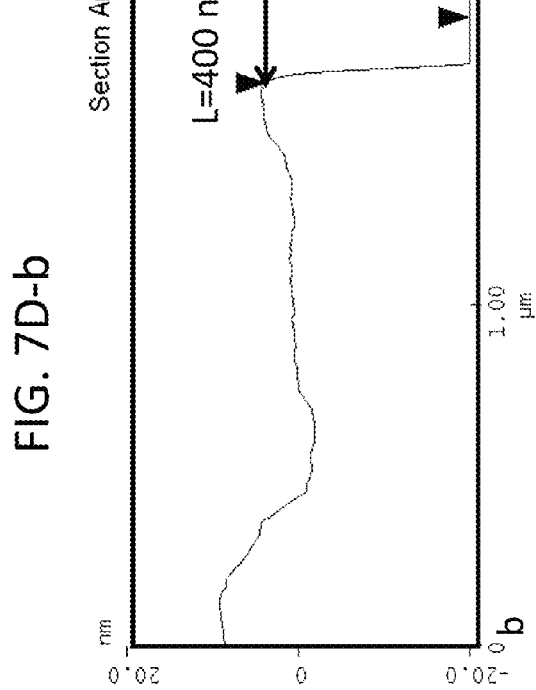
FIG. 7D-b

FIG. 9C

| MQW Active region 30 (otherwise quantum barrier/well possessing in-plane unit cell mismatch x) | 1000 (nanostructured layer with nanovoid surface filling factor y) y≥x for active-region to be strain-free or with significant strain-reduction |

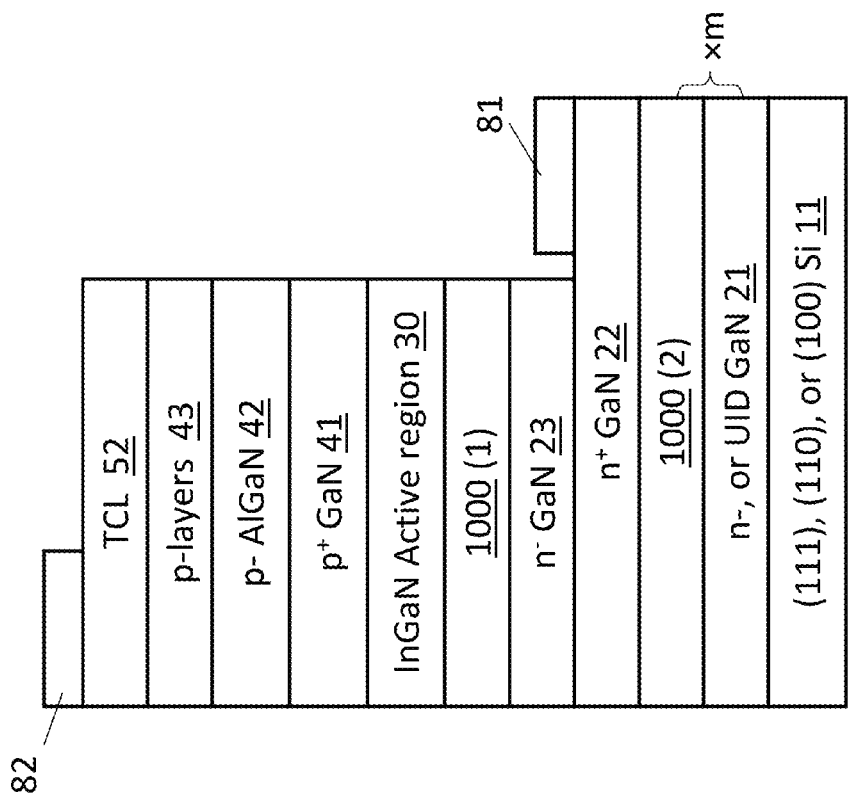

US 9,184,344 B2

LIGHTING-EMITTING DEVICE WITH NANOSTRUCTURED LAYER AND METHOD FOR FABRICATING THE SAME

1. FIELD OF THE INVENTION

The present invention relates in general to light-emitting device having nanostructured layer, more particularly to III-nitride light-emitting device having nanostructured nitride layer, or II-VI light-emitting device having nanostructured II-VI layer, and method for fabricating the same.

2. DESCRIPTION OF THE RELATED ART

III-nitride based light-emitting devices such as light-emitting diodes (LEDs) are widely acknowledged as the next generation light sources and are currently emerging as strong replacement of incandescent and fluorescent lamps in general lighting. For example, the field of interest uses Cerium-doped yttrium aluminum garnet (YAG:Ce) phosphor to convert InGaN multiple-quantum-well (MQW) LED's blue emission into white light, yielding commercial white light LEDs with luminous efficacies in the range of 80-130 lm/W. The R&D White LED luminous efficacy record reported so far has reached 183 lm/W (Y. Narukawa et al, J. Phys. D: Appl. Phys. 43, 354002 (2010).).

Further improvement in luminous efficacy requires lower device operation voltage, $V_f$, higher radiative internal quantum efficiency, IQE, and better light extraction efficiency, LEE. A straightforward method to reduce $V_f$ is to use heavily doped n-type and p-type layers in the LED structure, aiming at reducing series resistances of the LED. Better IQE in general requires better material quality and active-region design. Meanwhile, light extraction efficiency can be improved via modifying optical surfaces and interfaces to eliminate light reflection and absorption.

In the prior art, these three aspects affecting luminous efficacy have been treated more or less independently. Compromises are to be made as improving one aspect is usually at the expense of the other aspect. For example, using heavily doped n-GaN (Si doping level up to $2 \times 10^{19}$ cm$^{-3}$ has been employed in U.S. Pat. Nos. 6,630,692 and 7,026,653) for better current spreading can reduce device $V_f$, however, device IQE and LEE are likely to suffer because of the increased defect density and optical absorption from heavy doping. In another example, (e.g. U.S. Pat. No. 7,355,210) rough p-GaN layer has been employed to interrupt total internal reflection and assist photon escape from light-emitting devices. In this case, LEE benefits from p-GaN roughening treatment while leaving device to suffer from higher $V_f$ because of the reduced conductivity of rough p-GaN layer. To improve GaN/InGaN LED IQE, efforts have been made to form pits in the active-region so that dislocations are isolated from the active-region. These efforts were disclosed in the U.S. Pat. Nos. 6,329,667, 6,693,303, and 7,611,917. To effectively form pits in GaN/InGaN multiple quantum well active region, a large number of GaN/InGaN quantum wells (QWs) are needed. These large number of QWs can reduce device external quantum efficiency (EQE) and increase device $V_f$, because only the top 1-4 pairs of QWs close to p-layers contribute to light emission thanks to the heavy effective mass of holes and the large valence/conduction band offsets between GaN and InGaN. The rest quantum wells impede electron/hole transport resulting in high $V_f$ and absorb light emitted by the top 1-4 QWs leading to reduced EQE.

3. SUMMARY OF THE INVENTION

Disclosed herewith are a light emitting device having a nanostructured layer with nanovoids and method of manufacturing the same to improve light-emitting device's internal quantum efficiency, light extraction efficiency, reverse voltage, and forward voltage in a consistent way so as to overcome one or more of the above discussed deficiencies or other deficiencies of the prior art. High LED epi-wafer throughput is also enabled by reducing epitaxy time without measurably sacrificing device performance, or without sacrificing device performance.

One aspect of the present invention provides a nanostructured layer with nanovoids which can be incorporated into a conventional light-emitting or LED structure. In the field of III-nitride light-emitting structure or device, the nanostructured layer can be a nanostructured nitride layer. The nanostructured nitride layer in general can be made of doped or undoped $Al_xIn_yGa_{1-x-y}N$ with $0.1 \geq x \geq 0$ and $0.1 \geq y \geq 0$, or $1 \geq x \geq 0.5$ and $0.1 \geq y \geq 0$, for example, $Al_xGa_{1-x}N$ or $In_yGa_{1-y}N$, with GaN or AlN being a specific example. The nanostructured nitride layer can have a thickness of 50-1000 nm, for example 100-500 nm. The nanostructured nitride layer comprises randomly distributed nanovoids. The nanovoids may have a vertical dimension (depth in the direction of growth of the nanostructured nitride layer) equal or close to, or smaller than the thickness of the nanostructured nitride layer. For example, the nanovoids may have a depth of 20-550 nm. The nanovoids may have a finishing lateral dimension (as will be defined later) of 50-500 nm and a density of $2 \times 10^8$ cm$^{-2}$-$2 \times 10^9$ cm$^{-2}$. In another way of description, the nanovoids may have a nanovoid surface filling factor (as will be defined later) of 4%-50%.

Another aspect of the present invention provides a method of forming the nanostructured nitride layer. The method involves epitaxial growth of the nanostructured nitride layer at a temperature in the range of 650-950° C. The epitaxial growth can be performed under nitrogen ambient, or under nitrogen and ammonia ambient. The nanostructured nitride layer can be formed on another nitride layer or a nitride template layer. The another nitride layer or the nitride template layer is preferred to have threading dislocations of density $1 \times 10^3$ cm$^{-2}$-$2 \times 10^9$ cm$^{-2}$, for example, $1 \times 10^6$ cm$^{-2}$-$2 \times 10^9$ cm$^{-2}$, or $1 \times 10^8$ cm$^{-2}$-$1 \times 10^9$ cm$^{-2}$. The epitaxial growth can be performed at an epitaxial growth rate of 100 nm-600 nm per hour.

Another aspect of the present invention provides a light-emitting device and device structure such as a III-nitride or II-VI light-emitting device or structure. The light-emitting device or structure comprises at least one nanostructured layer. For III-nitride and II-VI light-emitting device or structure, the nanostructured layers are preferably nanostructured nitride layer and nanostructured II-VI layer, respectively. The nanostructured layer can be formed on any layer that is suitable for the nanostructured layer to grow thereon, such as a buffer layer, a template layer, an n-type layer for an active region, or a current spreading layer of a conventional light-emitting device or structure, and can be formed right below and adjacent to the active region and/or other location of a light-emitting device or structure. The nanostructured layer may also comprise a plurality of nanostructured sub-layers. A plurality of the nanostructured sub-layers and a plurality of other epitaxial layers are alternately formed on top of each other. Each of the nanostructured sub-layers may have similar or different features such as thickness in the range of 50-1000 nm, nanovoid surface filing factor in the range of 4%-50%, nanovoid density in the range of $2 \times 10^8$ cm$^{-2}$-$2 \times 10^9$ cm$^{-2}$, and finishing lateral dimension of nanovoids in the range of 50-500 nm.

In one embodiment, the nanostructured layer is formed over a substrate or template and below an n-type layer for an active region. Light-emitting devices according to this embodiment of the present invention possess improved reverse voltage sustaining and anti-electrostatic discharge capabilities.

In another embodiment according to this aspect of the present invention, the nanostructured layer is formed right below and adjacent to the active-region of a light-emitting device. Light-emitting devices according to this embodiment possess lower device operation voltage and higher internal and external quantum efficiencies compared to corresponding conventional light-emitting devices.

In still another embodiment according to this aspect of the present invention, the nanostructured layer is formed right below and adjacent to the active-region of a light-emitting structure, and a vertical thin film light-emitting device is formed by transferring the light-emitting structure to a superstrate and exposing the nanostructured layer for n-contact and/or n-type transparent current spreading layer. Light-emitting devices according to this embodiment possess improved device operation voltage and internal and external quantum efficiencies.

In another embodiment of III-nitride semiconductors according to this aspect of the present invention, the nanostructured nitride layer is formed right below and adjacent to the active-region of a light-emitting device. The light-emitting device emits ultraviolet (UV)—purple (380-430 nm) light, the nanostructured nitride layer comprises nanovoids with a nanovoid surface filling factor not less than 4%, for example, 4%-50%, or 4%-6%.

In another embodiment of III-nitride semiconductors according to this aspect of the present invention, the nanostructured nitride layer is formed right below and adjacent to the active-region of a light-emitting device. The light-emitting device emits blue-cyan (430-500 nm) light, the nanostructured nitride layer comprises nanovoids with nanovoid surface filling factor not less than 6%, for example, 6%-50%, or 6%-12%.

In another embodiment of III-nitride semiconductors according to this aspect of the present invention, the nanostructured nitride layer is formed right below and adjacent to the active-region of a light-emitting device. The light-emitting device emits green-yellow (500-580 nm) light, the nanostructured nitride layer comprises nanovoids with a nanovoid surface filling factor not less than 12%, for example, 12%-50%, or 12%-20%.

In another embodiment of III-nitride semiconductors according to this aspect of the present invention, the nanostructured nitride layer is formed below and adjacent to the active-region of a light-emitting device. The light-emitting device emits amber-red (580-630 nm) light, the nanostructured nitride layer comprises nanovoids with a nanovoid surface filling factor not less than 20%, for example, 20%-50%, or 20%-30%.

Another aspect of the present invention provides a UV light-emitting device or structure. The UV light-emitting device emits UV light with wavelengths from 240 nm to 380 nm. The UV light-emitting device comprises AlGaN based active-region, which is formed over a nitride layer stack comprising a slightly doped n$^-$-AlGaN, a heavily doped n$^+$-AlGaN, a nanostructured nitride layer, and an unintentionally doped (UID) GaN layer in sequence. The nitride layer stack can be formed on a substrate such as a sapphire, GaN, AlN, Si substrate. The nanovoid surface filling factor of this nanostructured nitride layer is equal to or greater than 4%, for example, in the range of 4% to 50%, or 4% to 8%, such as 5% or 6%. In some embodiment, a vertical thin film UV light-emitting device is formed by transferring the UV light-emitting structure to a superstrate and exposing the heavily doped n$^+$-AlGaN layer for n-contact. UV light-emitting devices according to this embodiment possess improved device operation voltage and internal and external quantum efficiencies.

Still another aspect of the present invention provides a nitride light-emitting device or structure on Si substrate. The Si substrate can be (111)-orientated, or (110)-oriented, or (100)-oriented. The light-emitting device or structure on Si substrate comprises at least one nanostructured nitride layer, or two nanostructured nitride layers with a first nanostructured nitride layer positioned right below and adjacent to the active-region of the light-emitting device, and a second nanostructured nitride layer positioned beneath n-type layer of the active region and over the Si substrate. The nanovoid surface filling factor of the first nanostructured nitride layer is chosen according to active-region light emission wavelengths, as set forth in this specification. The nanovoid surface filling factor of the second nanostructured nitride layer can be in the range of 4%-50%, for example, 10%, 20%, 30%, or 40%. The second nanostructured nitride layer can be inserted for several times in-between the Si substrate and the n-type layer, for example, 2 times, 3 times, or 5 times. The multiple second nanostructured nitride layers are separated by nitride layers. In other words, the second nanostructured nitride layer may comprise a plurality of nanostructured nitride sub-layers similar to the ones discussed above. In general, when the nanovoid surface filling factor is smaller, more insertions of the second nanostructured nitride layer are preferred.

Light-emitting devices on Si substrate according to this aspect of the present invention are substantially crack-free or crack-reduced, and possess improved device operation voltage and internal and external quantum efficiencies.

Another aspect of the present invention provides a method for reducing strain between a first epitaxial layer and a second epitaxial layer of different inherent in-plane lattice constants in a light-emitting device. The method comprises:

calculating an in-plane lattice mismatch, $\gamma$, between the first and the second epitaxial layers assuming the second epitaxial layer is coherently formed on the first epitaxial layer;

calculating an in-plane unit cell mismatch, $\Omega$, between the first and the second epitaxial layers using equation $\Omega = (1+\gamma)^2 - 1$;

preparing a nanostructured layer having nanovoids with a nanovoid surface filling factor not less than the absolute value of the in-plane unit cell mismatch, $\Omega$;

forming the first epitaxial layer on the nanostructured layer;

forming the second epitaxial layer on the first epitaxial layer.

Optionally, the first epitaxial layer is a quantum barrier layer and the second epitaxial layer is a quantum well layer of an active region. Optionally, the active region is a nitride active region and the nanostructured layer is a nanostructured nitride layer.

Another aspect of the present invention provides a light emitting device comprising:

a first epitaxial layer;

a second epitaxial layer having a different inherent in-plane lattice constant than that of the first epitaxial layer and formed on the first epitaxial layer;

an active region; and a first nanostructured layer having nanovoids with a nanovoid surface filling factor not less than the absolute value of an in-plane unit cell mismatch, $\Omega$, for the second epitaxial layer coherently formed on the first epitaxial layer, and, wherein $\Omega=(1+\gamma)^2-1$, where $\gamma$ is an in-plane lattice mismatch for the second epitaxial layer coherently formed on the first epitaxial layer, and wherein the first epitaxial layer is formed on the first nanostructured layer.

Optionally, the first epitaxial layer is a quantum barrier layer of the active region and the second epitaxial layer is a quantum well layer of the active region. Optionally, the active region is a nitride active region and the first nanostructured layer is a nanostructured nitride layer. Optionally, the active region is made of II-VI semiconductors and the first nanostructured layer is a nanostructured II-VI layer.

Optionally, the first epitaxial layer is a template layer, the second layer is a current spreading layer, and the active region is formed over the current spreading layer. Optionally, the light emitting device comprises a (111)-oriented, or (110)-oriented, or (100)-oriented Si substrate, wherein the first nanostructured layer is a nanostructured nitride layer formed over the Si substrate.

Optionally, the light emitting device comprises a second nanostructured layer, a current spreading layer, and a lightly doped layer formed on the current spreading layer, wherein the current spreading layer is formed on the second nanostructured layer, and the first nanostructured layer is formed over the lightly doped layer.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function. Throughout this disclosure, like reference number represents like part.

Figure 7A:
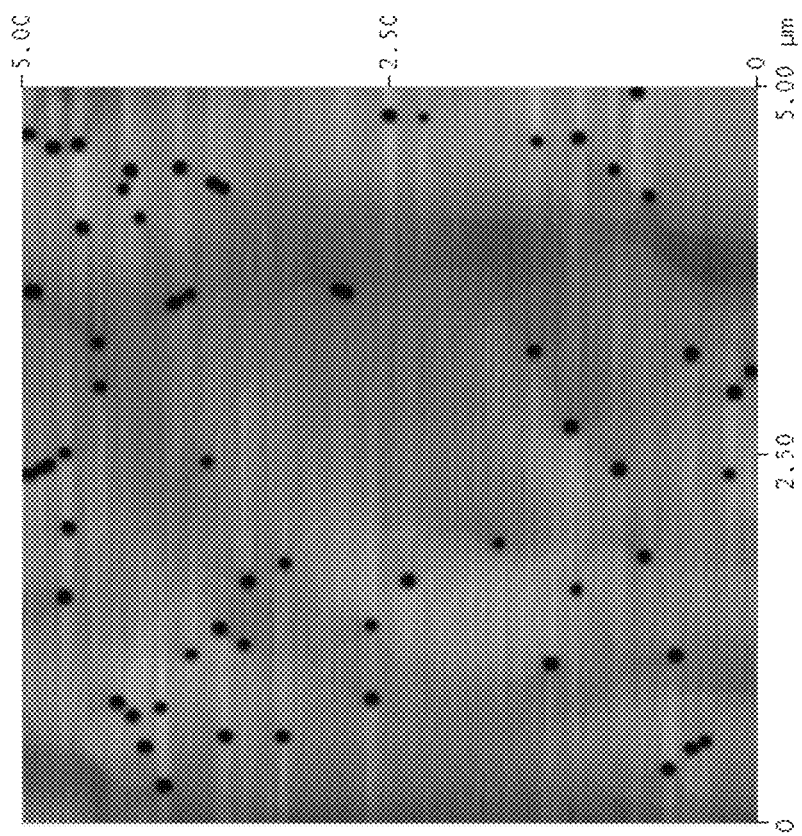
FIG. 7A-FIG. 7C show surface morphology measured by AFM (5 μm×5 μm scans) of nanostructured GaN layers with different nanovoid surface filling factors.
Figure 7B:
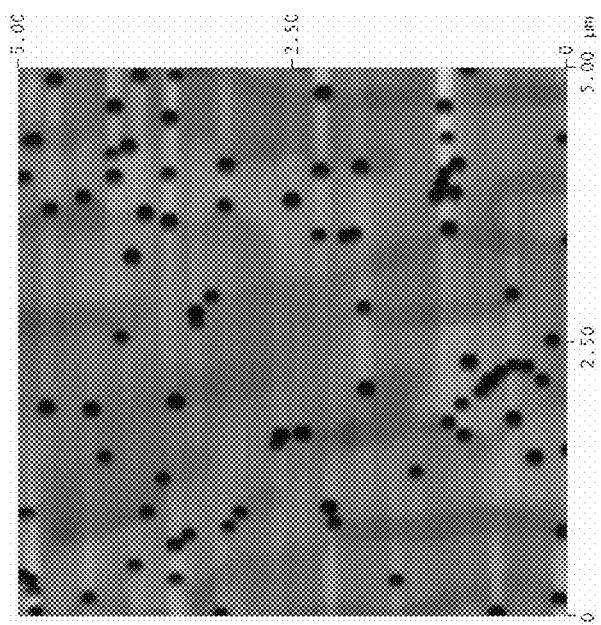
Figure 7C:
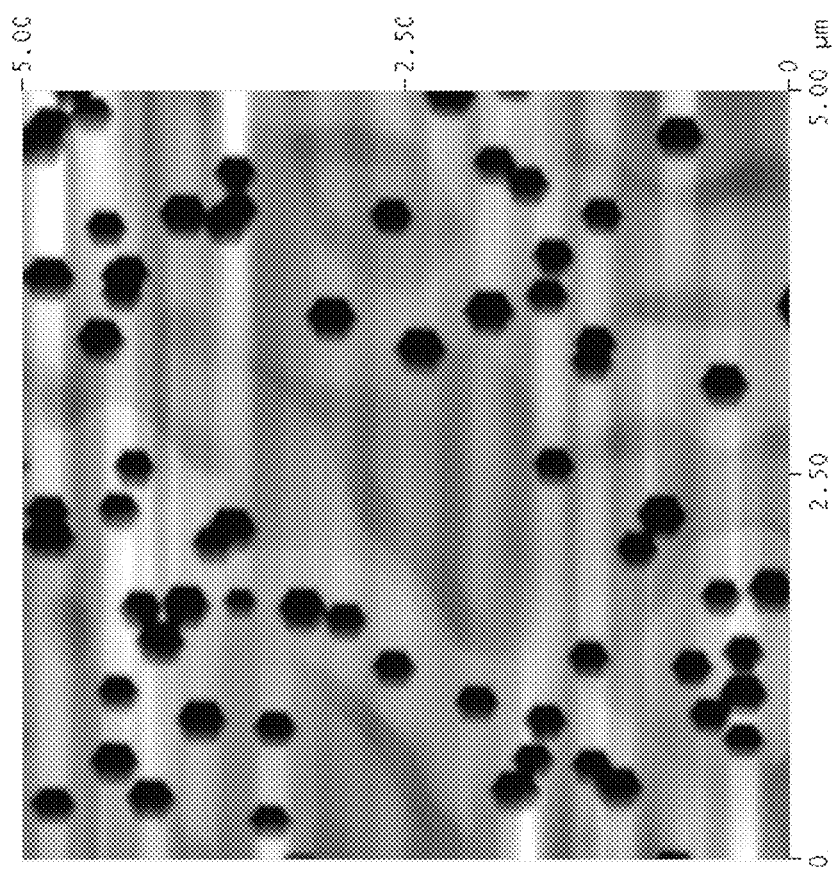

FIG. 7D-a shows the enlarged surface morphology scan (2 μm×2 μm) of the nanostructured GaN layer from FIG. 7C.

FIG. 7D-b shows the cross-sectional scan of an individual nanovoid.

Figure 8A:
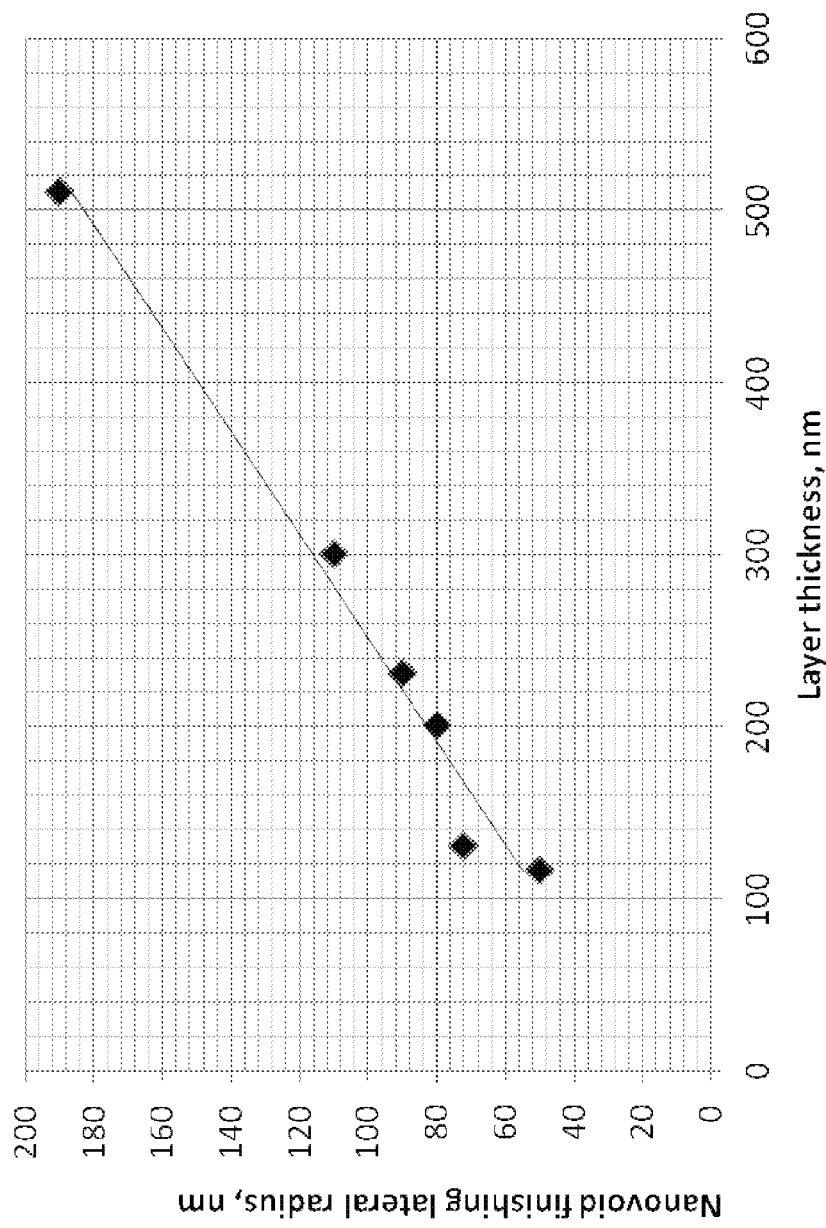

FIG. 8A plots the correlation of finishing lateral radius of nanovoid vs nanostructured GaN layer thickness.

Figure 8B:
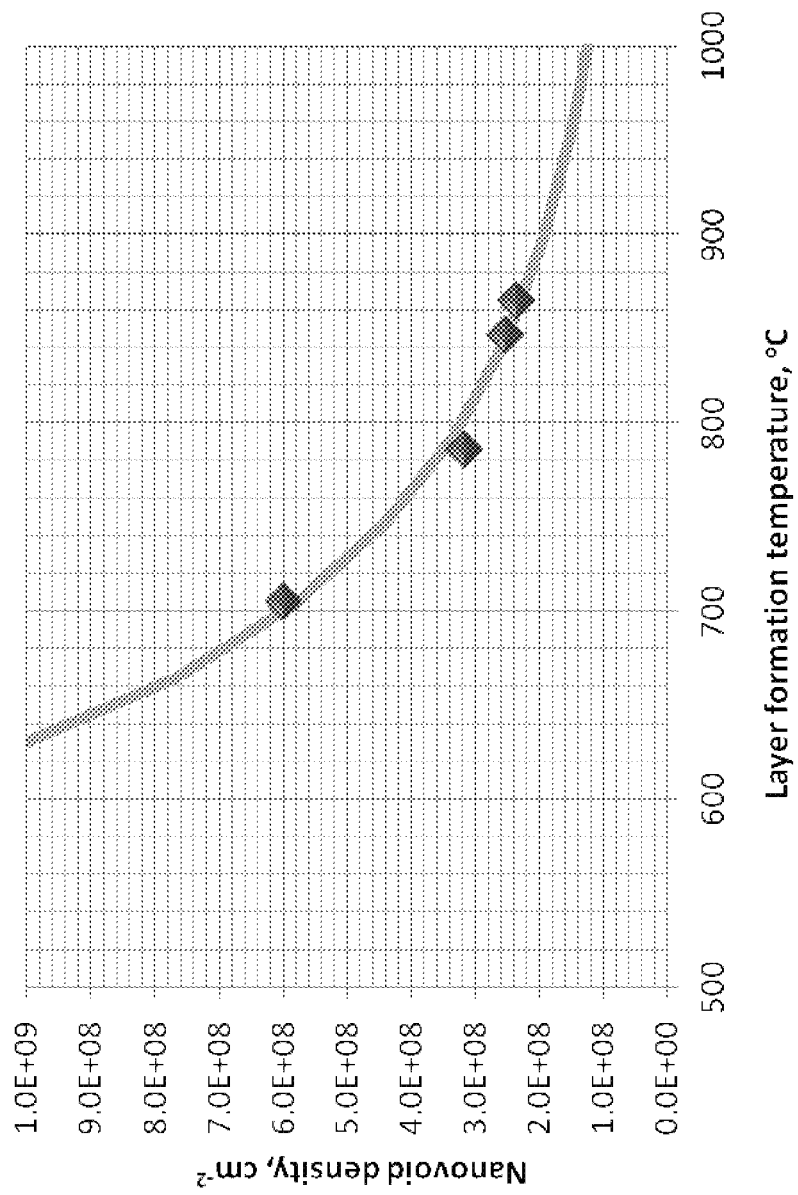

FIG. 8B plots the correlation of nanovoid density vs nanostructured GaN layer formation temperature.

Figure 8C:
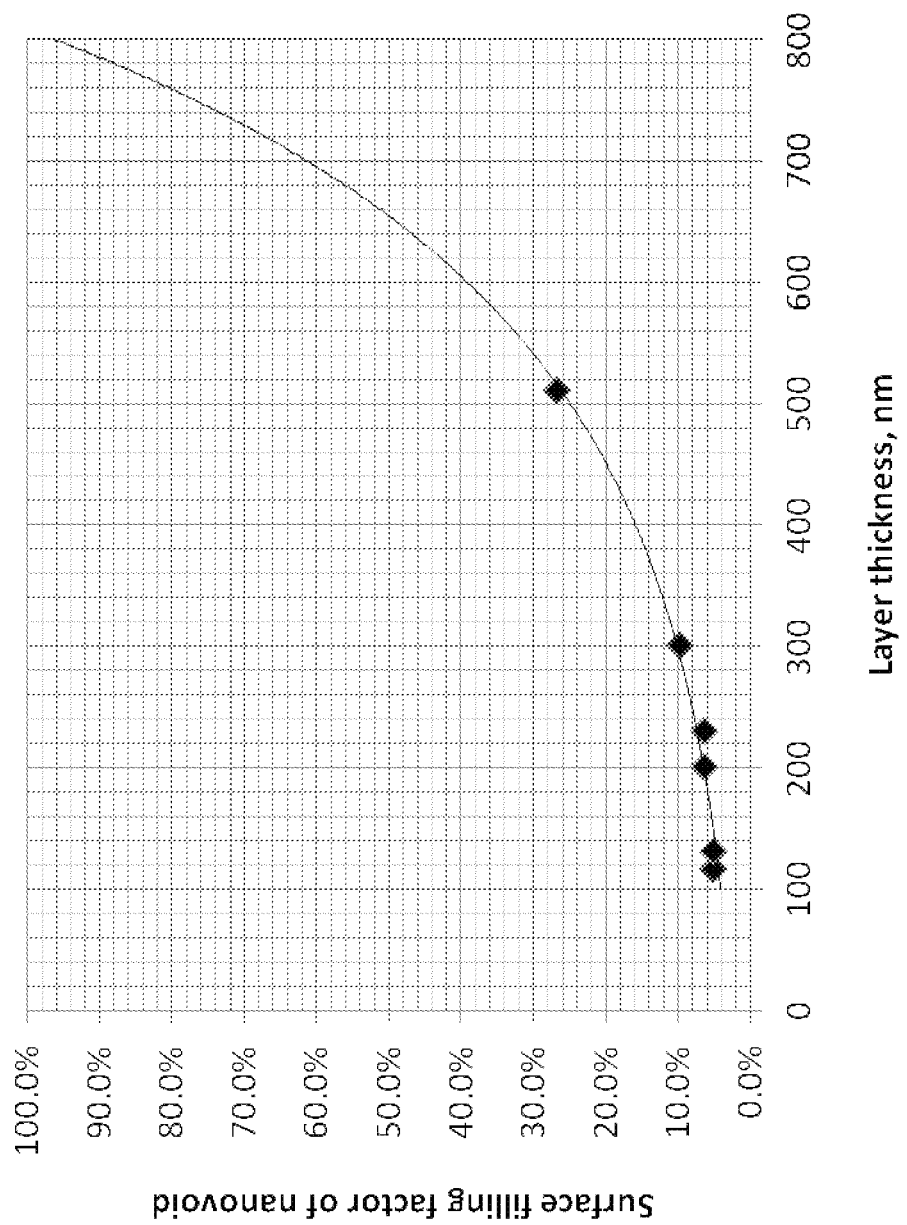

FIG. 8C plots the relationship of nanovoid surface filling factor vs nanostructured GaN layer thickness.

Figure 9A:
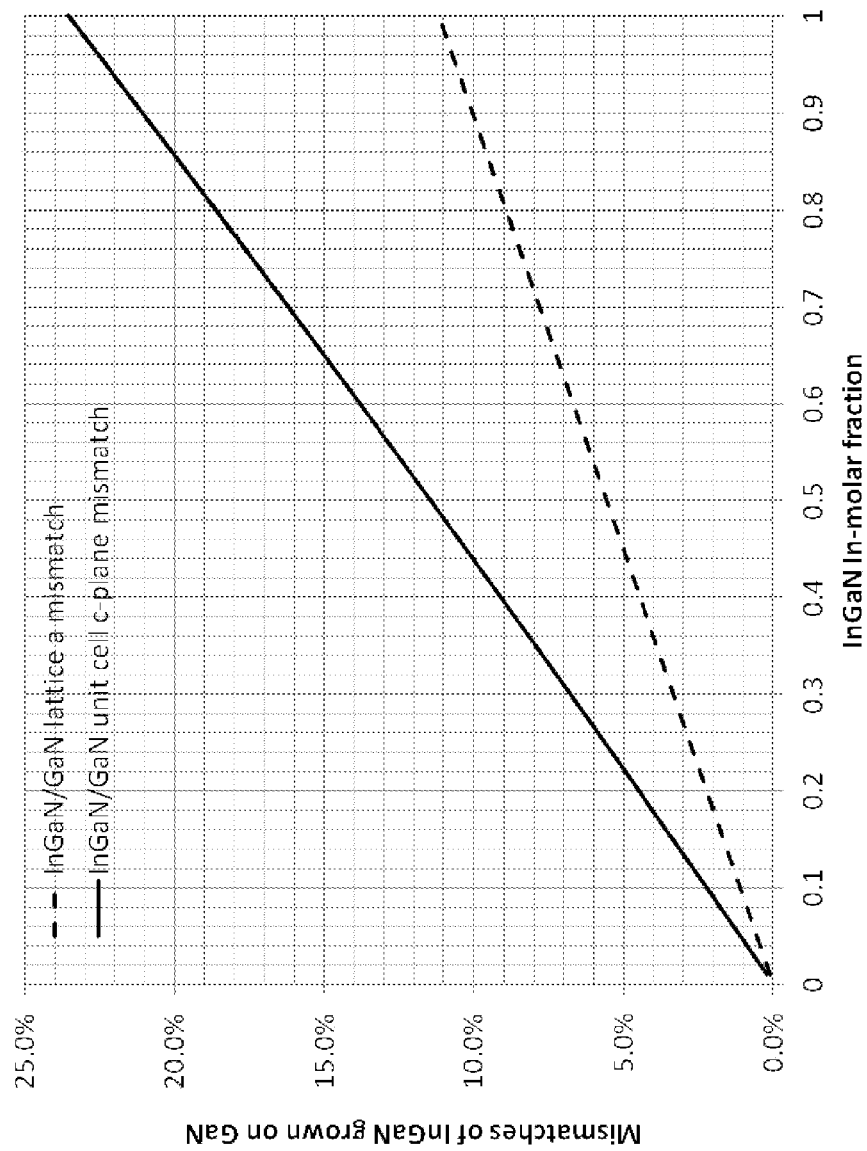

FIG. 9A plots the functions with In-content of lattice "a" mismatch and unit cell c-plane mismatch of InGaN formed on GaN.

Figure 9B:
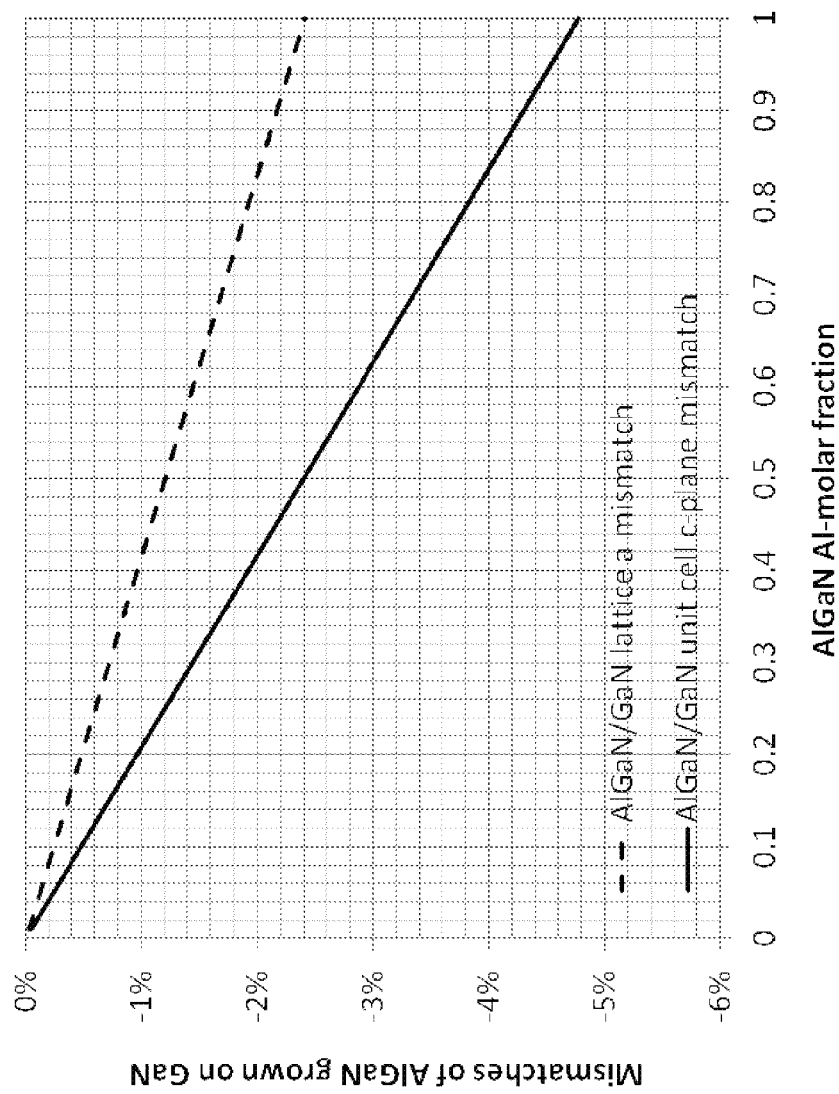

FIG. 9B plots the functions with Al-content of lattice "a" mismatch and unit cell c-plane mismatch of AlGaN formed on GaN.

FIG. 9C illustrates the general selection rule of nanostructured layer for active-region to achieve a strain-free or significant strain-reduction status.

Figure 9D:
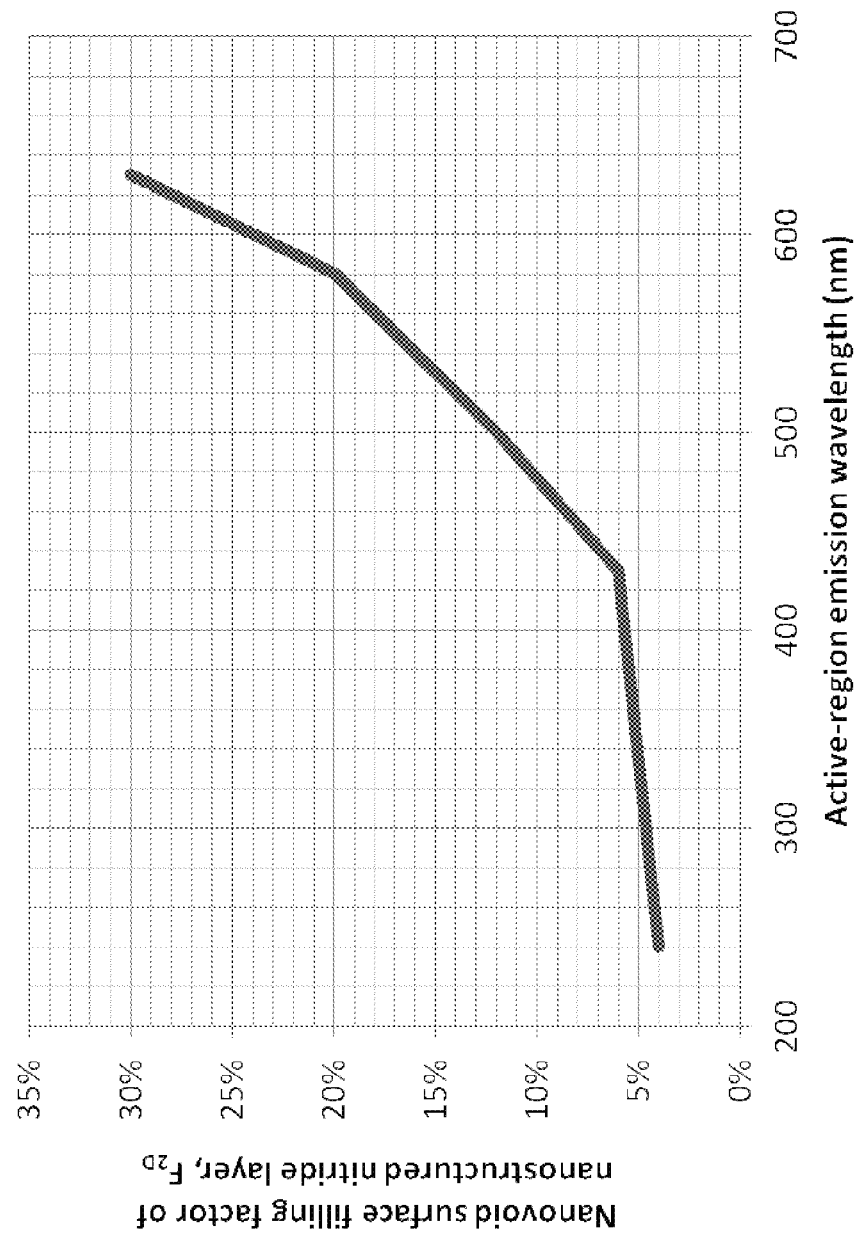

FIG. 9D illustrates the general selection rule according to the present invention of nanostructured layer for active-region of different emission wavelength.

FIG. 10 illustrates the layered structure of an LED embodiment formed over Si substrate according to one aspect of the present invention.

Figure 3:
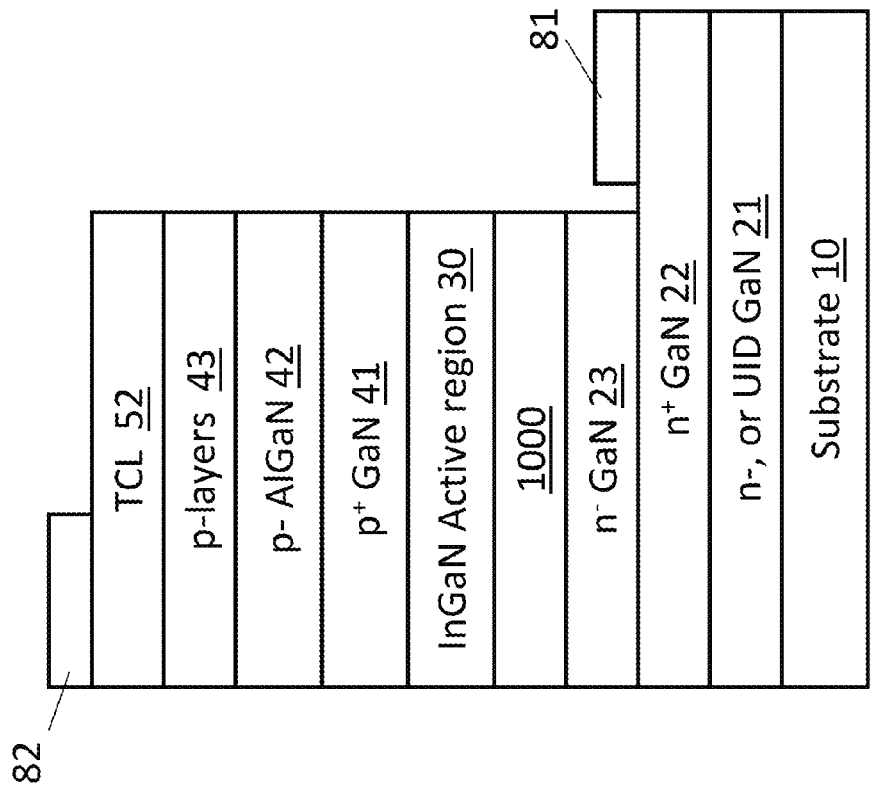
FIG. 3 illustrates the layered structure of an LED embodiment according to one aspect of the present invention.
Figure 11:
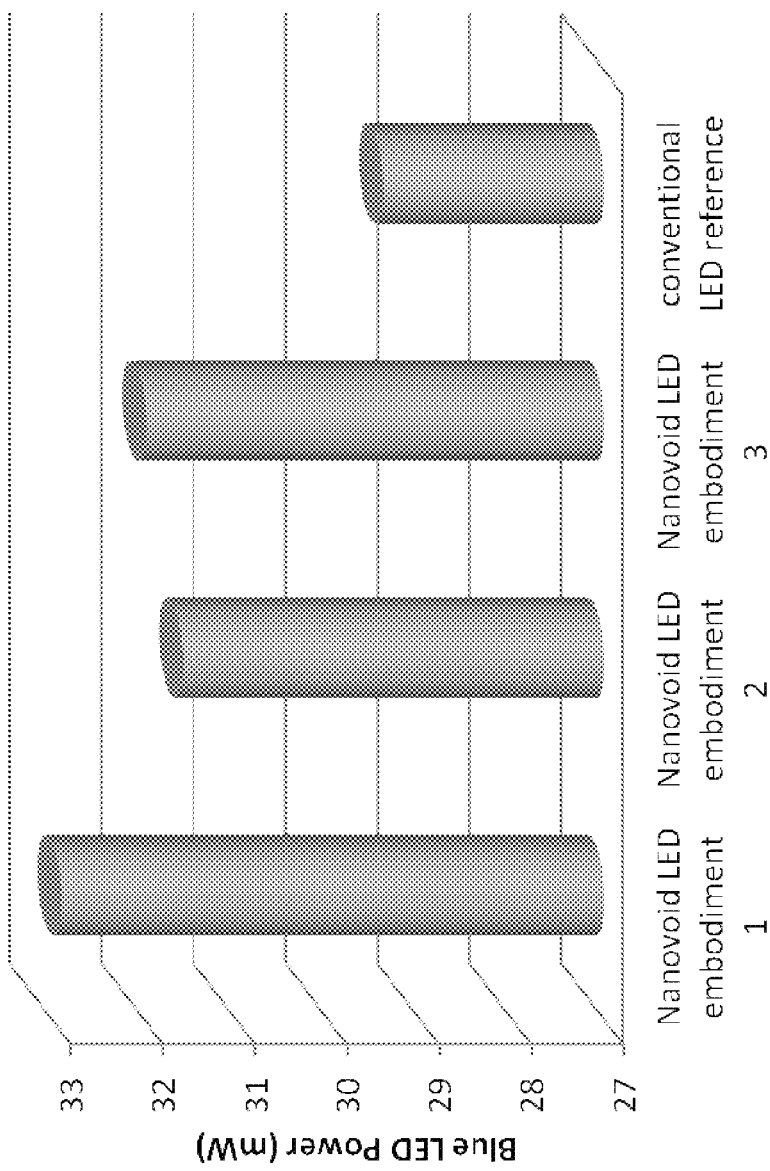

FIG. 11 shows blue LED emitting power values measured at 20 mA for LEDs according to embodiments shown in FIG. 3 and FIG. 7B, in comparison to a reference conventional blue LED.

5. DETAILED DESCRIPTION OF EMBODIMENTS

Throughout the specification, the term III-nitride or nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with (1-x-y-z)≤10%. A III-nitride layer or active-region means that the layer or active-region is made of III-nitride semiconductors.

Throughout the specification, the term II-VI semiconductor in general refers to semiconductors with cations and anions respectively selected from group IIB and group VIA of the periodic table of the elements. That is to say, II-VI semiconductors include ZnO, ZnS, ZnSe, ZnTe, CdO, CdS, CdSe, CdTe and their ternaries and quaternaries. A II-VI layer or active-region means that the layer or active-region is made of II-VI semiconductors.

In the following contents, nitride light-emitting devices or structures are used as embodiments to elucidate the principle and spirit of the present invention. Those of ordinary skills in the field can apply the teachings in this specification and given by the following embodiments of nitride light-emitting devices or structures to II-VI semiconductor and other semiconductor devices or light-emitting devices without creative work.

Figure 1:
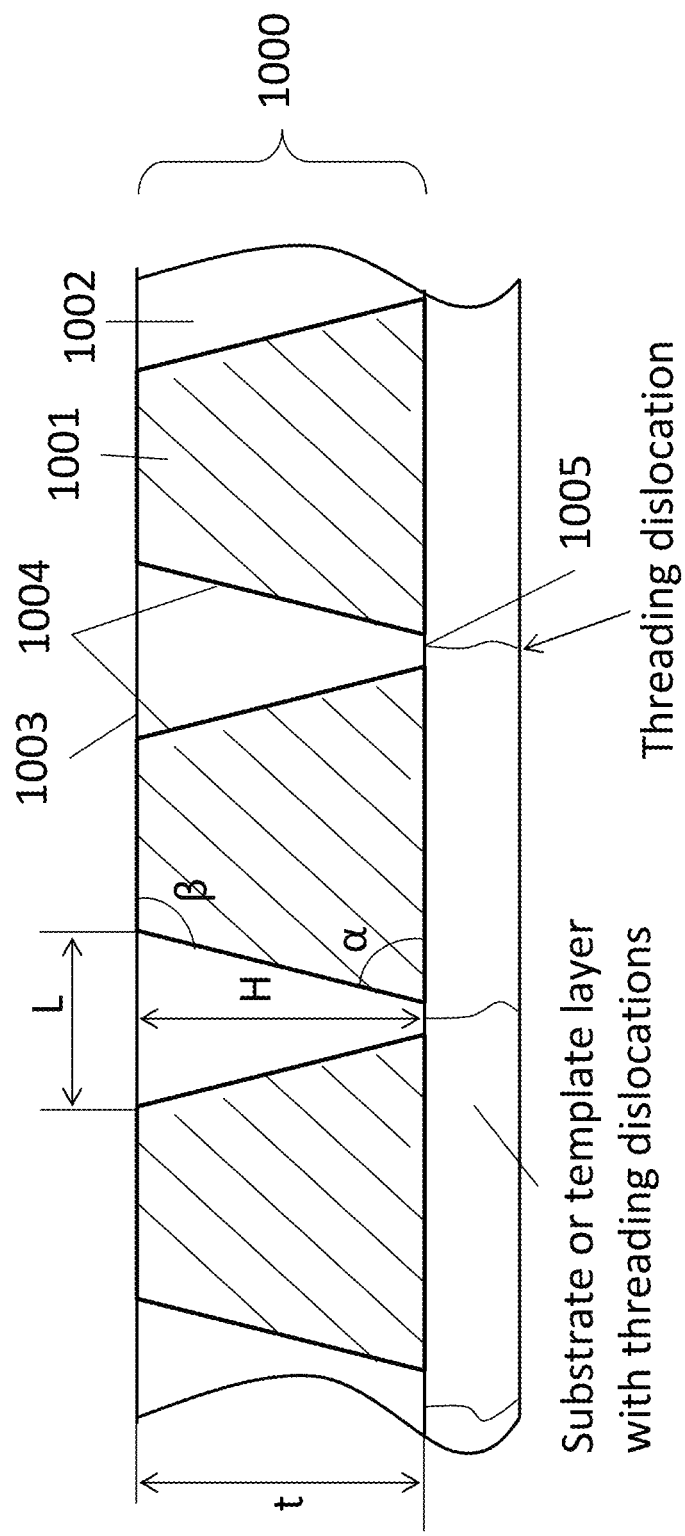
FIG. 1 illustrates the cross-sectional view of a nanostructured layer according to an embodiment of the present invention.

FIG. 1 illustrates the cross-sectional view of a nanostructured nitride layer according to an embodiment of the present invention. Nanostructured nitride layer 1000 shown in FIG. 1 has a thickness t and comprises plurality of nanovoids 1002 and material layer body 1001. Individual nanovoid 1002 is defined by sidewall surface 1004. The top of nanovoid 1002 is exposed to upper surface 1003 of nanostructured nitride layer 1000, forming an opening to provide a site for strain-relaxation and lateral growth of a subsequent epitaxial layer. The bottom of nanovoid 1002 may or may not be exposed to lower surface 1005 of nanostructured nitride layer 1000. The depth H of nanovoid 1002 can be substantially equal to or smaller than the thickness t of nanostructured layer 1000, i.e., H≤t. In the case of H<t, the bottom part of nanovoid 1002 may be not exposed to the lower surface 1005. Sidewall surface 1004 has an angle, α, to the lower surface 1005. Usually, angle α may vary within the range of equal to or smaller than 90° so as to enable the formation of nanovoids 1002 during the epitaxial growth of nanostructured nitride layer 1000. In most cases, there is an inclined angle α (α is smaller than 90°) between sidewall surface 1004 and lower surface 1005 as shown in FIG. 1. There is an angle β between sidewall surface 1004 and upper surface 1003. When the profile of the vertical cross-section of nanovoid 1002 is a straight line from lower surface 1005 to upper surface 3 as shown in FIG. 1, β=180°−α. This relationship usually holds for an epitaxially grown nanostructured nitride layer 1000. However, β and α do not necessarily always have such relationship. The profile of the vertical cross-section of nanovoid 1002 is not necessarily a straight line; it can be a curved line or of irregular shape, as long as the opening of nanovoid 1002 can provide a site for lateral epitaxial growth for a subsequent layer and strain-relaxation. In addition to the nanovoid surface finishing lateral dimension L, the angle β between sidewall surface 1004 and upper surface 1003 also plays a role in promoting lateral epitaxial growth of a subsequent layer and strain-relaxation. In some embodiments, angle β can be equal to or smaller than 160°, for example, 107-155°. In other embodiments, angle β can be equal to or smaller than 90°, for example, after nanostructured nitride layer is grown over certain thickness or is formed by a method other than epitaxial growth. Material layer body 1001 forms a continuous phase with nanovoids 1002 distributed therein and may provide a continuous upper surface 1003 for subsequent epitaxial growth. The lateral cross section of top portion of nanovoid 1002 can be larger than that of its bottom portion. Further, the opening of nanovoid 1002 has a finishing lateral dimension, L, at the upper surface 1003 on which a subsequent epitaxial layer growth takes place. The finishing lateral dimension, L, is the largest across sectional dimension of the opening of nanovoid 1002 at the upper surface 1003. In this disclosure, the term finishing lateral radius is also used which is defined equal to L/2. The finishing lateral dimension L, the depth H, the angle β, and the shapes of the opening of nanovoids 1002 and the combination thereof can chosen according to the teachings of the present invention as long as the openings of nanovoids 1002 can efficiently provide sites for a subsequent nitride layer's lateral growth and strain reduction.

Nanostructured nitride layer 1000 can be made of group III nitride $Al_xIn_yGa_{1-x-y}N$ with $0.1 \geq x \geq 0$ and $0.1 \geq y \geq 0$, or $1 \geq x \geq 0.5$ and $0.1 \geq y \geq 0$, such as $Al_xGa_{1-x}N$, or $In_yGa_{1-y}N$, with a specific example being GaN, and another specific example being AlN. It can be undoped, or optionally doped with n-type dopant such as silicon (Si). If of n-type doping, the doping level optionally can be in the range of $1\text{-}50 \times 10^{17}$ $cm^{-3}$, and the doping can be uniform or graded doping, or with different doping concentration along the formation direction of nanostructured nitride layer 1000. Nanostructured nitride layer 1000 can be a single layer with uniform or varying composition, or multiple layers each with different compositions. The thickness, t, of nanostructured nitride layer 1000 can be in the range of 50-1000 nm, for example 100-550 nm, or 200-400 nm. Nanovoids 1002 can be distributed randomly within nanostructured nitride layer 1000. The plan-view shape of the opening of nanovoids 1002 in the embodiments shown in FIG. 7A-FIG. 7D is circular or hexagonal. But, the plan-view shape of the opening of nanovoids 1002 in other embodiments may have other regular or irregular shapes. The depth, H, of nanovoids 1002 can be in the range of 20-550 nm, for example 50-400 nm, or 100-300 nm, or can be the same as the thickness of nanostructured nitride layer 1000. Nanovoids 1002 can have a finishing lateral dimension, L, of 50-500 nm, and a density of $2 \times 10^8$ $cm^{-2}$-$2 \times 10^9$ $cm^{-2}$. In another way of description, nanovoids 1002 can be randomly and/or uniformly distributed within nanostructured nitride layer 1000 with a surface filling factor of 4%-50% which can also be adjusted to have other values as desired according to the described principle of the present invention.

The nanovoid surface filling factor ($F_{2D}$) is defined by the ratio of surface area occupied by the openings of nanovoids 1002 over the whole surface area of the nanostructured nitride layer 1000 as measured at the upper surface 1003 on which subsequent epitaxial growth takes place. Before any subsequent layer growth on top of nanostructured nitride layer 1000, the nanovoid surface filling factor can be easily measured by a surface mapping metrology such as atomic force microscope (AFM). After subsequent epitaxial layers formed over nanostructured nitride layer 1000, it is difficult to evaluate the nanovoid surface filling factor of nanostructured nitride layer 1000 by surface mapping metrology. Instead, transmission electron microscope (TEM) can be used to evaluate the buried-in nanovoid features. For example, plan-view TEM can be used to evaluate the buried-in nanovoid density, distribution, size, and surface filling factor. In addition, cross-section TEM may be used to locate the nanovoid layer position in a multi-layer structure. That is to say, using the combination of plan-view TEM and cross-section TEM measurements, one can evaluate the nanovoid features of a nanostructured layer buried in multi-layers. TEM technology and sample preparation are well-known in the field of interest.

Nanostructured nitride layer 1000 can be formed via epitaxial growth on a suitable substrate or a nitride template layer known to the field of interest. For example, suitable substrates include, but not limited to, sapphire, GaN, AlN, Si, and GaAs substrate et al, with threading dislocation density of $1 \times 10^3$ $cm^{-2}$-$2 \times 10^9$ $cm^{-2}$, for example, $1 \times 10^6$ $cm^{-2}$-$2 \times 10^9$ $cm^{-2}$, or $1 \times 10^8$ $cm^{-2}$-$1 \times 10^9$ $cm^{-2}$. Nanostructured nitride layer 1000 can also be formed on AlN-containing, GaN-containing, or InN-containing template layer, such as AlN, GaN, InN, AlGaN, InGaN, or AlInGaN layer, with threading dislocation density of $1 \times 10^3$ $cm^{-2}$-$2 \times 10^9$ $cm^{-2}$, for example, $1 \times 10^6$ $cm^{-2}$-$2 \times 10^9$ $cm^{-2}$, or $1 \times 10^8$ $cm^{-2}$-$1 \times 10^9$ $cm^{-2}$. Usually, higher threading dislocation density will promote the formation of nanovoids in the nanostructured nitride layer. In addition to threading dislocation, other defects in the substrate or template layer such as impurities may also promote the formation of nanovoids in the nanostructured nitride layer. Epitaxial growth methods such as hydride vapor phase epitaxy (HVPE), molecular beam epitaxy (MBE), and metalorganic chemical vapor deposition (MOCVD) can be employed to form nanostructured nitride layer 1000. The epitaxial growth formation of nanostructured nitride layer 1000 can be performed in the temperature range of 650-950° C., for example, 750-950° C., or 800-900° C. The epitaxial growth ambient can be nitrogen-containing, or nitrogen and/or ammonia-containing ambient. And the epitaxial growth may have an epitaxial growth rate of, for example, 100 nm-600 nm per hour, however, the growth rate is not limited to this range. The present inventors believe that nitrogen ambient can increase surface energy in the vicinal areas surrounding threading dislocations and impurities. This will suppress crystal growth thereof, resulting in nanovoid formation.

When nanostructured nitride layer 1000 is (0001)-oriented, the inclined angle, α, can be in the range of 25-73 degree which can translate into an angle β in the range of 107-155 degree. Referring to Table 1, this means sidewall surface 1004 shown in FIG. 1 can be formed by crystal planes selected from (10.1), (10.2), (10.3), (10.4), (11.1), (11.2), (11.3), (11.4), (11.5), and (11.6).

TABLE 1

Inclined planes and angles to (00.1)
plane in wurtzite structure crystals

| inclined plane | angle to c-plane (deg) |
| --- | --- |
| (10.1) | 61.9 |
| (10.2) | 43.2 |
| (10.3) | 32 |
| (10.4) | 25 |
| (11.1) | 72.9 |
| (11.2) | 58.4 |
| (11.3) | 47.3 |
| (11.4) | 39.1 |
| (11.5) | 33 |
| (11.6) | 28.5 |

Formation of sidewall surface 1004 via epitaxial growth by some of these crystal planes is enabled at lower epitaxial temperature in the range of 650-950° C., such as 750-950° C., or 800-900° C. and with addition of nitrogen and/or ammonia to the epitaxial growth ambient. According to the present inventors, lowering epitaxial temperature will reduce adatom surface kinetic energy, and the addition of nitrogen to growth ambient will increase surface energy in the vicinal areas surrounding threading dislocations and impurities. One kind of impurity is carbon or oxygen which can have increased incorporation rate at lower epitaxial temperatures. In some embodiment, nitrogen is added to the epitaxial growth ambient without adding ammonia, generating a growth ambient of little or no hydrogen, which may further enhance nanovoid formation. These two factors combined effectively result in nanovoid formation surrounding threading dislocations or impurities. It is noted that the threading dislocations can be from a substrate or a template on which nanostructured nitride layer 1000 is formed. The threading dislocations within nanostructured nitride layer 1000 can also be formed at the early stage of formation of nanostructured nitride layer 1000, as a result of the reduced epitaxial temperature. This is to say, the density of nanovoids 1002 can be controlled via epitaxial growth template, and can further be adjusted by the formation conditions of nanostructured nitride layer 1000. Therefore, a nanostructured nitride layer 1000 can be grown at a fixed temperature, or at two or more different temperatures by sequentially increasing or decreasing growth temperature, or at continuously changing temperature by gradually increasing or decreasing temperature. This also discloses that the surface filling factor of nanovoids 1002 can be well-controlled via growth substrate/template selection and growth conditions optimization.

In the following embodiments, nanostructured nitride layer 1000 made of GaN is formed on a GaN template layer with dislocation density of $5\times10^8$ cm$^{-2}$ by MOCVD process.

A wafer comprising a 3 μm-thick (0001) GaN template layer with a threading dislocation density of $5\times10^8$ cm$^{-2}$ formed on a c-plane sapphire is positioned in an MOCVD reactor, under ammonia and nitrogen ambient with a pressure in the range of 100-500 torr. The wafer temperature is set between 650° C.-950° C. Gallium source such as trimethylgallium (TMG) or triethylgallium (TEG) is introduced into the reactor with flow rate setting for a growth rate of 100-600 nm/hour. After a predetermined epitaxial growth time, nanostructured nitride layer 1000 is formed on the 3 μm-thick (0001) GaN template layer with a predetermined thickness. The surface morphology and nanovoid formation mechanism are then evaluated by a surface mapping metrology such as atomic force microscope (AFM). Further, important parameters of nanovoids such as nanovoid density, size, and surface filling factor are extracted from AFM surface scans.

Surface morphologies of three nanostructured GaN layers measured by AFM are presented in FIG. 7A-FIG. 7D. As seen, nanovoids of various densities and various sizes are demonstrated. These embodiments of nanostructured GaN layers (nanostructured nitride layer 1000) shown in FIG. 7A-7D are formed on a 3 μm-thick (0001) GaN template layer with a threading dislocation density of $5\times10^8$ cm$^{-2}$, which in turn is formed on a c-plane sapphire substrate via MOCVD. Nanovoids are randomly distributed in these nanostructured GaN layers.

The embodiment of nanostructured GaN layer shown in FIG. 7A is formed via MOCVD in an ammonia and nitrogen ambient with ammonia and nitrogen flow rate being of 45 and 53 SLPM (standard liter per minute), respectively. The MOCVD reactor pressure is 200 torr and epitaxial temperature is 847° C. TEG is used as Ga source. The growth rate is 200 nm per hour, and the thickness of the nanostructured GaN layer shown in FIG. 7A is 200 nm. As seen, under such conditions of nanostructured nitride layer formation, the nanovoid density is about $3.2\times10^8$ cm$^{-2}$, and the finishing lateral radius is about 80 nm, translating into a nanovoid surface filling factor ($F_{2D}$) of 6.5%.

The embodiment of nanostructured GaN layer shown in FIG. 7B is formed under the same conditions as those discussed in connection to the embodiment shown in FIG. 7A, except that Ga source is TMG, and the growth rate and layer thickness are of 300 nm per hour and 300 nm, respectively. As seen, under such conditions of nanostructured nitride layer formation, the nanovoid density is about $2.52\times10^8$ cm$^{-2}$, and the finishing lateral radius is about 110 nm, translating into a nanovoid surface filling factor ($F_{2D}$) of 9.8%.

The embodiment of nanostructured GaN layer shown in FIG. 7C is formed under the same conditions as those discussed in connection to the embodiment shown in FIG. 7B, except that the growth rate, layer thickness, and growth temperature are of 510 nm per hour, 510 nm, and 865° C., respectively. As seen, under such conditions of nanostructured nitride layer formation, the nanovoid density is about $2.36\times10^8$ cm$^{-2}$, and the finishing lateral radius is about 190 nm, translating into a nanovoid surface filling factor ($F_{2D}$) of 26.8%.

Another embodiment of nanostructured GaN layer is formed under the same conditions as those discussed in connection to the embodiment shown in FIG. 7B, except that the growth rate, layer thickness, and growth temperature are of 116 nm per hour, 116 nm, and 705° C., respectively. Under such conditions of nanostructured nitride layer formation, the nanovoid density is about $6.0\times10^8$ cm$^{-2}$, and the finishing lateral radius is about 50 nm, translating into a nanovoid surface filling factor ($F_{2D}$) of 5.3%.

Another embodiment of nanostructured GaN layer is formed under the same conditions as those discussed in connection to the embodiment shown in FIG. 7A via MOCVD in an ammonia and nitrogen ambient with ammonia and nitrogen flow rate being of 45 and 53 SLPM (standard liter per minute), respectively. The MOCVD reactor pressure is 200 torr and epitaxial temperature is 847° C., and TEG is used as Ga source. The growth rate is 130 nm per hour, and the thickness of the nanostructured GaN layer is 230 nm. Under such conditions of nanostructured nitride layer formation, the nanovoid density is about $2.52\times10^8$ cm$^{-2}$, and the finishing lateral radius is about 90 nm, translating into a nanovoid surface filling factor ($F_{2D}$) of 6.4%.

Another embodiment of nanostructured GaN layer is formed under the same conditions as those discussed in connection to the embodiment shown in FIG. 7A via MOCVD in an ammonia and nitrogen ambient with ammonia and nitrogen flow rate being of 45 and 53 SLPM (standard liter per minute), respectively. The MOCVD reactor pressure is 200 torr and epitaxial temperature is 786° C., and TEG is used as Ga source. The growth rate is 130 nm per hour, and the thickness of the nanostructured GaN layer is 130 nm. Under such conditions of nanostructured nitride layer formation, the nanovoid density is about $3.16 \times 10^8$ cm$^{-2}$, and the finishing lateral radius is about 72.5 nm, translating into a nanovoid surface filling factor ($F_{2D}$) of 5.2%.

Based on those embodiments shown in FIG. 7A-7C, in FIG. 8A-FIG. 8C, important parameters of nanovoids are extracted as function of growth conditions. As shown in FIG. 8A, the finishing lateral radius (L/2) of nanovoids are observed to be dependent on nanostructured GaN layer thickness, the thicker the layer, the larger the nanovoid finishing radius. When the thickness of nanostructured GaN layer is increased from about 120 nm to about 510 nm, the nanovoid finishing lateral radius increases from about 50 nm to about 190 nm. The nanovoid density is observed to be nanostructured GaN layer epitaxial temperature dependent, the higher the epitaxial temperature, the less the nanovoid density, as plotted in FIG. 8B. As seen in FIG. 8B, when the epitaxial temperature is increased from about 700° C. to about 865° C., the density of nanovoids decrease from about $6.0 \times 10^8$ cm$^{-2}$ to about $2.0 \times 10^8$ cm$^{-2}$. In FIG. 8C, the surface filling factors of nanovoids are plotted against nanostructured GaN layer thickness, revealing the fact that the thicker the layer, the larger the nanovoid surface filling factor develops. When the layer thickness is increased from about 100 nm to about 500 nm, nanovoids surface filling factor increases from about 5% to about 30%.

It is noted that in the embodiments shown in FIG. 7A-FIG. 8C the nanostructured nitride layers are nanostructured GaN layers grown on GaN template layers. Other nanostructured nitride layer (for example, InGaN layer with In-molar-fraction less than 6%) grown on other nitride template layer or on substrate discussed above have a similar trend as that of the above discussed nanostructured GaN layers in terms of the relationships between finishing lateral radius and layer thickness, between nanovoid density and nanostructured nitride layer epitaxial temperature, and between surface filling factor and layer thickness. Therefore, the epitaxial growth temperature, the growth rate, and the thickness of the nanostructured nitride layer can be selected and adjusted to obtain desired surface filling factor, nanovoid density, or fishing lateral radius according to the relationship trend discussed and shown above.

The above embodiments show a nanovoids surface filling factor from about 5% to about 30%. If desirable, the nanovoid surface filling factor of nanostructured nitride layer 1000 may also be made to have other values such as 4% to 50% and even as high as 60%, or higher.

Nanostructured nitride layer 1000 can be a single layer of uniform or varying composition, or multiple layers each with different compositions. That is to say, nanostructured Al$_x$In$_y$Ga$_{1-x-y}$N layer, nanostructured Al$_x$Ga$_{1-x}$N layer, nanostructured In$_y$Ga$_{1-y}$N layer, nanostructured Al$_x$Ga$_{1-x}$N/GaN multiple layers, and nanostructured GaN/In$_y$Ga$_{1-y}$N multiple layers can all be formed with desired nanovoid densities and sizes and desired nanovoid surface filling factors. In these embodiments, Al-content and In-content are preferred to be less than or equal to 10% (0.1≥x and 0.1≥y). For example, a 10-100 nm-thick In$_y$Ga$_{1-y}$N (0.01≤y≤0.06) can be formed directly on a nanostructured GaN layer with nanovoid surface filling factor of 10%, serving as a nanostructure nitride layer 1000 for subsequent layers' formation.

In a light-emitting device, many layers, sometimes hundreds of layers, of different compositions are stacked. Layers of different composition formed on top of each other usually suffer from lattice mismatch. For example, a thin-film of c-plane InN deposited on a thick c-plane GaN template layer suffers from 11.16% c-plane lattice mismatch if fully coherently formed, and a thin-film of c-plane AlN deposited on a thick c-plane GaN template layer suffers from −2.41% c-plane lattice mismatch if fully coherently formed. Throughout the present specification, the lattice mismatch, $\Upsilon$, for a thin film coherently formed on a thick film, is defined as:

$$Y = \frac{a_{thin} - a_{thick}}{a_{thick}} \times 100\%, \quad \text{(Equation 1)}$$

where $\alpha_{thin}, \alpha_{thick}$ are the inherently lattice constants of the thin and thick films, respectively.

The lattice mismatch if not being compensated will reveal itself as strain of equal value mostly exerted to the thin film as the thin film is coherently formed on the thick template. That is to say, a thin-film of c-plane InN deposited on a thick c-plane GaN template layer suffers from 11.16% biaxial compressive strain if fully coherently formed, and a thin-film of c-plane deposited on a thick c-plane GaN template layer suffers from 2.41% biaxial tensile strain if fully coherently formed. As a practical rule and being known in the field, the thick template layer needs to be at least 1000 times thicker than the thin film so as the lattice mismatch being converted into equal size of strain can be regarded as being fully exerted to the thin film when the thin film is coherently formed on the thick template layer. Usually, the lattice mismatch (so that the strain) can be compensated by misfit dislocations. That is to say, the large lattice mismatch can result in defect formation which is detrimental to device performance. For piezoelectric materials such as III-nitrides and II-VI semiconductors (ZnO, CdS, ZnS, CdTe, et al), the lattice-mismatch resultant strain can also introduce electric field which will increase device voltage and reduce device quantum efficiency. Therefore, for III-nitride and II-VI semiconductor light-emitting devices, obtaining strain-free structure has been continuously studied and researched in the art in order to achieve high device performance.

Besides the above discussed concept of lattice mismatch, the present inventors introduce another important concept when dealing with strained material systems. The present inventors introduce the concept of crystal unit cell in-plane mismatch.

If in-plane lattice mismatch between two epitaxial layers is $\Upsilon$, and in-plane unit cell mismatch between the two epitaxial layers is $\Omega$, then:

$$\Omega = (1+\Upsilon)^2 - 1 \quad \text{(Equation 2)}$$

Using Equation 2, c-plane in-plane lattice mismatches and unit cell mismatches of a thin InGaN layer grown on a thick GaN layer, and a thin AlGaN layer grown on a thick GaN layer are plotted in FIG. 9A and FIG. 9B, respectively. As seen from FIG. 9A, depending on In-content, a thin InGaN layer coherently formed on a thick GaN layer suffers from a lattice mismatch up to 11.16% and a unit cell mismatch up to 23.57%. Also as seen from FIG. 9B, depending on Al-content, a thin AlGaN layer coherently formed on a thick GaN layer suffers from a lattice mismatch up to −2.41% and a unit cell mismatch up to −4.77%.

It is beneficial to use in-plane unit cell mismatch together with in-plane lattice mismatch to investigate strained epitaxial layers since epitaxial growth of layers takes place two-dimensionally. The present inventors propose to use nanovoid surface filling factor to compensate the in-plane unit cell mismatch. For example, if InGaN quantum wells coherently grown on GaN barriers in the MQW active-region possess an in-plane unit cell mismatch of x, to compensate this x mismatch, a strain-relief template layer made of nanostructured layer with nanovoid surface filling factor not less than x is preferably selected for the GaN/InGaN MQW active-region according to this invention. This principle is clearly illustrated in FIG. 9C, wherein a nanostructured layer 1000 with nanovoid surface filling factor of y is applied for an MQW active-region 30. Without nanostructured layer 1000, quantum wells in the MQW active-region 30 would suffer from x in-plane unit cell mismatch with quantum barriers in the MQW active-region 30. With nanostructured layer 1000 of a nanovoid surface filling factor of y, the quantum well-quantum barrier in-plane unit cell mismatch in the MQW active-region 30 generally will be reduced, according to the present inventors. Further, the present inventors believe that with more decrease of the value (x−y), the mismatch reduction will be more significant, so is the strain reduction within the quantum wells of the MQW active-region 30 as Equation 2 teaches. The present inventors further believe that when the nanovoid surface filling factor is not less than the in-plane unit cell mismatch (y≥x), active-region 30 can even reach strain-free status or be with significant strain-reduction. The selection of proper nanostructured layer for active-region according to the present invention can help to obtain high-performance light-emitting devices made of piezoelectric materials.

According to the principle illustrated in FIG. 9C, the preferred selection rules of nanostructured nitride layer for different nitride active-region are plotted in FIG. 9D. AlGaN and InGaN active-regions are adopted respectively for UV emissions and visible emissions. Referring to FIG. 9A, FIG. 9B, FIG. 9C, and FIG. 9D, the following preferred selection rules of nanostructured nitride layer for different active-regions are given:

For UVC-UVA-Purple active-region (λ=240 nm to 430 nm), preferably select nanostructured nitride layer of nanovoid surface filling factor ($F_{2D}$) not less than 4%, optionally not larger than 50%, for example 4%-6%.

For blue-cyan active-region (λ=430 nm to 500 nm), preferably select nanostructured nitride layer of nanovoid surface filling factor ($F_{2D}$) not less than 6%, optionally not larger than 50%, for example 6%-12%.

For green-yellow active-region (λ=500 nm to 580 nm), preferably select nanostructured nitride layer of nanovoid surface filling factor ($F_{2D}$) not less than 12%, optionally not larger than 50%, for example 12%-20%.

For amber-red active-region (λ=580 nm to 630 nm and above), preferably select nanostructured nitride layer of nanovoid surface filling factor ($F_{2D}$) not less than 20%, optionally not larger than 50%, for example 20%-30%.

In all the cases listed above, the nanovoid surface filling factors can be selected in a range between the above described lower limit and an optional upper limit of 50% or 60%.

It is understood that the above selection rules are preferred based on minimizing strain in the quantum wells. If based on other criteria such as light-extraction efficiency (LEE) and internal quantum efficiency (IQE), the preferred selection rules may be deviated from the above mentioned ones. Therefore, it is intended in this invention that it is preferable to select a nanostructured nitride layer of nanovoid surface filling factor ($F_{2D}$) not less than 4% as the growth template for nitride based light-emitting active-regions. In consideration of the combined effects in minimizing strain in the quantum wells, enhancing light-extraction efficiency (LEE) and internal quantum efficiency (IQE), and other effects, particular suitable nanovoid surface filling factor ($F_{2D}$) can be chosen according to the teaching of this invention, which can even be outside the above described range of 4%-50%.

Figure 2:
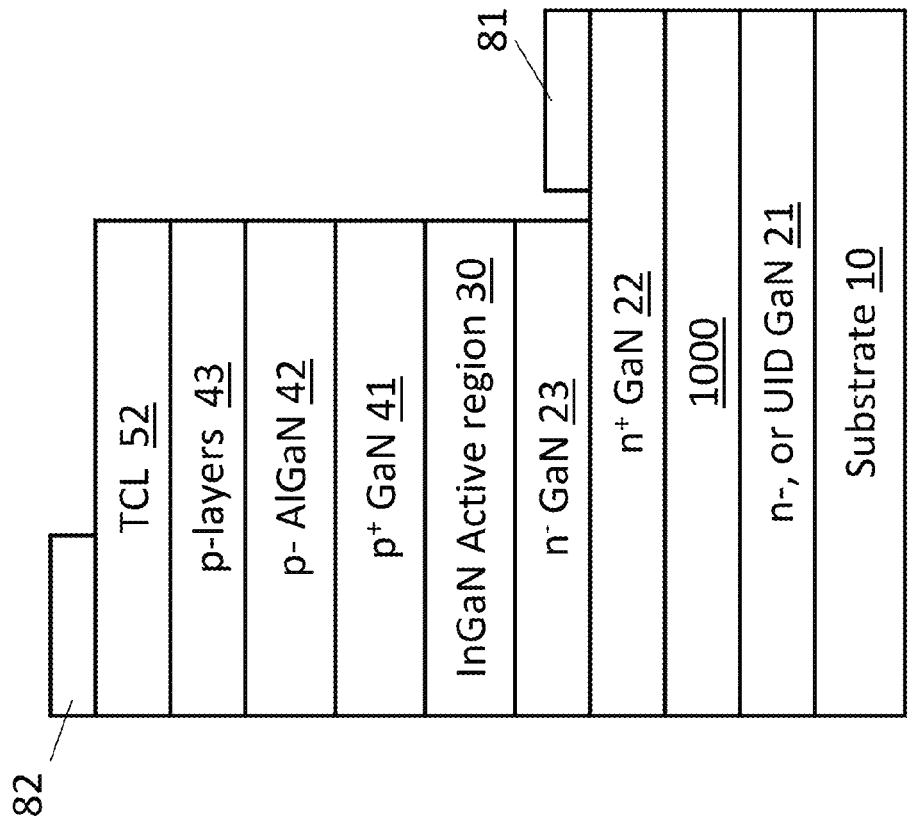
FIG. 2 illustrates the layered structure of an LED embodiment according to one aspect of the present invention.

Now turn to FIG. 2. Shown in FIG. 2 is an embodiment according to the present invention for InGaN-based active-region light-emitting device. Substrate 10 can be sapphire, Si, GaN, AlN, SiC, GaAs and the like. Formed over substrate 10 is a GaN-containing layer 21, which can be made of unintentionally doped (UID) or Si-doped GaN, with a thickness, for example, ranging from 500 nm to 5000 nm. Here layer 21 serves as a template layer. Following layer 21 is a nanostructured nitride layer 1000, as described in the previous context. In the present embodiment, nanostructured nitride layer 1000 may have a nanovoid surface filling factor ($F_{2D}$) in the range of 4%-50%. Nanovoids 1002 within layer 1000 can isolate threading dislocations by blocking threading dislocations in layer 1000. This dislocation blockage effect can improve device quantum efficiency and electrical characteristics. Formed over nanostructured nitride layer 1000 is an n$^+$-layer 22 for current spreading. Layer 22 can be Si-doped GaN with doping level, for example, up to $2\times10^{19}$ cm$^{-3}$, with a thickness, for example, up to 3000 nm. Layer 22 is followed by a lightly doped GaN layer 23 with Si-doping in the $1\text{-}8\times10^{17}$ cm$^{-3}$ range. An InGaN containing active-region 30 can be made of a single quantum well InGaN layer, or GaN/InGaN multiple quantum well (MQW), i.e., with multiple InGaN quantum wells each separated by a GaN quantum barrier. Following the active-region 30 are p-type layers which may contain in overlying sequence a p$^+$ GaN layer 41, a p-AlGaN layer 42, and other optionally p-layers 43. On top is a transparent current layer (TCL) 52 which can be indium tin oxide, zinc oxide et al. Finally, p-electrode 82, and n-electrode 81 are formed for electrical connection, respectively on TCL 52 and layer 22.

A difference between the light-emitting device of the embodiment shown in FIG. 2 and prior art light-emitting device is the insertion of a nanostructured nitride layer 1000 below the n$^+$-layer 22.

In some embodiments, nanostructured nitride layer 1000 can be inserted into layer 22. That is, layer 1000 is formed between two layers 22 with the layer 22 below nanostructured nitride layer 1000 serving as a template layer.

In other embodiments, layer 1000 can be inserted into layer 21. That is, layer 1000 is formed between two layers 21 with the layer 21 below nanostructured nitride layer 1000 serving as a template layer.

In some embodiments, layer 1000 can be inserted for more than once, for example, inserted twice in layer 21 (or 22), or inserted three times in layer 21 (or 22). In other words, here the nanostructured nitride layer 1000 comprises a plurality of nanostructured nitride sub-layers. The layer 21 (or 22) or in general a template layer comprises a plurality of template sub-layers, and the nanostructured nitride sub-layers and the template sub-layers layer are alternately formed on top of each other. Each of the nanostructured nitride sub-layers may have similar or different thickness, nanovoid surface filing factor, nanovoid density, and finishing lateral dimension within the range as discussed above in connection with individual nanostructured nitride layer.

Shown in FIG. 3 is another embodiment according to the present invention. The layered structure of the light-emitting device as shown is otherwise similar to that of the embodiment shown in FIG. 2, except that, instead of being inserted below layer 22, here nanostructured nitride layer 1000 is inserted right below and adjacent to the InGaN containing active-region 30. Active-region 30 can be made of GaN/InGaN MQW. The nanostructured nitride layer here is formed on the lightly doped GaN layer 23 with Si-doping in the range of $1-8\times10^{17}$ cm$^{-3}$. The lightly doped GaN layer 23 may have a threading dislocation density of $1\times10^3$ cm$^{-2}$-$2\times10^9$ cm$^{-2}$, for example, $1\times10^6$ cm$^{-2}$-$2\times10^9$ cm$^{-2}$, or $1\times10^8$ cm$^{-2}$-$1\times10^9$ cm$^{-2}$. Layer 23 also can be any conventional n-type layer with a threading dislocation density of $1\times10^3$ cm$^{-2}$-$2\times10^9$ cm$^{-2}$, for example, $1\times10^6$ cm$^{-2}$-$2\times10^9$ cm$^{-2}$, or $1\times10^8$ cm$^{-2}$-$1\times10^9$ cm$^{-2}$ and suitable for a III nitride active region.

In the embodiment shown in FIG. 3, nanostructured nitride 1000 optionally is a nanostructured GaN layer. It can be undoped, or doped with Si in the range of $1-50\times10^{17}$ cm$^{-3}$. The doping can be performed with desired gradient in direction of layer formation of nanostructured layer 1000. For example, the gradient can be zero, which means uniform doping within nanostructured nitride layer 1000. The gradient can also be a negative or positive constant, which means a linear decrease or increase of doping level in the layer formation direction. The gradient can also comprise a few spikes (approximately of δ-function), which means that the doping profile can be of staircase function in direction of the layer formation. For example, in some embodiments, nanostructure nitride (or GaN) layer 1000 may comprise or alternatively consist of a first GaN layer of 100 nm-thick without doping, a second GaN layer of 100 nm-thick with Si-doping in the range of $3-5\times10^{17}$ cm$^{-3}$, and a third GaN layer of 100 nm-thick with Si-doping in the range of $1-5\times10^{18}$ cm$^{-3}$. In other embodiments, nanostructure nitride (such as GaN) layer 1000 may comprise or alternatively consist of a first GaN layer of 100 nm-thick with Si-doping in the range of $3-5\times10^{17}$ cm$^{-3}$, a second GaN layer of 100 nm-thick without doping, and a third GaN layer of 100 nm-thick with Si-doping in the range of $1-5\times10^{18}$ cm$^{-3}$.

In some embodiments, the nanostructured layer 1000 can be inserted for more than once, for example, inserted twice, or inserted three times in layer 23. In other words, here the nanostructured nitride layer 1000 comprises a plurality of nanostructured nitride sub-layers. The n-type layer 23 or in general an n-type layer for an active region comprises a plurality of n-type sub-layers, and the nanostructured nitride sub-layers and the n-type sub-layers are alternately formed on top of each other. Each of the nanostructured nitride sub-layers may have similar or different thickness, nanovoid surface filing factor, nanovoid density, and finishing lateral dimension within the range as discussed above in connection with individual nanostructured nitride layer.

Depending on the emission wavelengths from active-region 30, nanostructured nitride layer 1000 is selected according to the following preferred selection rules (as set forth):

For light-emitting device emitting ultraviolet (UV)—purple (380-430 nm) light, nanostructured nitride layer 1000 preferably has a nanovoid surface filling factor not less than 4%, optionally not larger than 50%, for example 4%-6%.

For light-emitting device emitting blue-cyan (430-500 nm) light, nanostructured nitride layer 1000 preferably has a nanovoid surface filling factor not less than 6%, optionally not larger than 50%, for example 6%-12%.

For light-emitting device emitting green-yellow (500-580 nm) light, nanostructured nitride layer 1000 preferably has a nanovoid surface filling factor not less than 12%, optionally not larger than 50%, for example 12%-20%.

For light-emitting device emitting amber-red (580-630 nm) light, nanostructured nitride layer 1000 preferably has a nanovoid surface filling factor not less than 20%, optionally not larger than 50%, for example 20%-30%.

In all the cases listed above, the nanovoid surface filling factors can be selected in a range between the above described lower limit and an optional upper limit of 50% or 60%.

LEDs fabricated according to the embodiment shown in FIG. 3 possess lower $V_f$ as compared to prior art LEDs which have a similar structure but without nanostructured nitride layer 1000. It has been experimentally observed that blue LEDs according to the embodiment shown in FIG. 3 have a $V_f$ reduction of 0.1-0.15V, as compared to corresponding prior art blue LEDs. Green LEDs according to the embodiment shown in FIG. 3 have a $V_f$ reduction of 0.15-0.25V, as compared to corresponding prior art green LEDs. Amber LEDs according to the embodiment shown in FIG. 3 have a $V_f$ reduction of 0.35-0.45V, as compared to corresponding prior art amber LEDs. The $V_f$ reduction is attributed to the absence or reduction of piezoelectric field within quantum barriers of the active-region formed over the nanostructured nitride layer 1000 for strain-relief.

In some blue LED examples according to the embodiment shown in FIG. 3, the nanostructured nitride layer 1000 is made of GaN with a thickness of about 300 nm and a nanovoid surface filling factor $F_{2D}$ of 9.8% (the nanostructured nitride layer 1000 embodiment as shown in FIG. 7B), $V_f$ values are successfully reduced from 3.1 V, of a conventional reference blue LED, to 2.9 V. Further, the emitting powers are increased from 29.4 mW to over 32.8 mW, (~7%-12% increase), as seen from FIG. 11.

The embodiment of light-emitting device shown in FIG. 3 may further contain another nanostructured nitride layer 1000 below n$^+$-layer 22, as illustrated in FIG. 2.

Figure 4:
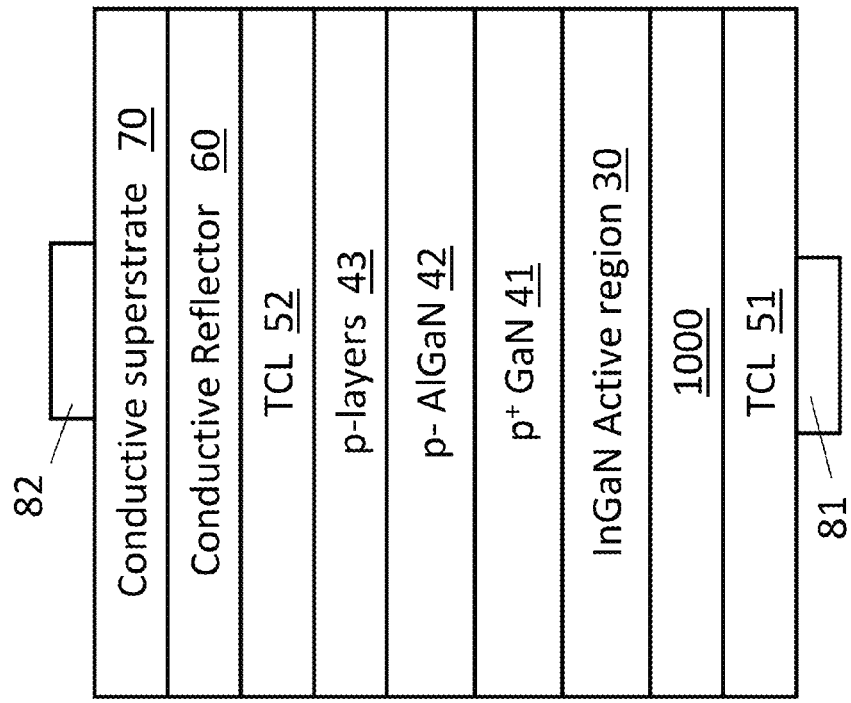
FIG. 4 illustrates the layered structure of a vertical thin-film LED embodiment according to one aspect of the present invention.

The embodiment of light-emitting device shown in FIG. 3 can further be converted into a vertical thin-film light-emitting device, as shown in FIG. 4. The fabrication of vertical thin-film light-emitting device is known in the prior art, for example, as disclosed in the U.S. Pat. No. 7,202,141, and US patent application Ser. No. 12/953,290, which are herein incorporated by reference in their entirety. In brief, for the light-emitting structure illustrated in FIG. 3, after the TCL layer 52 is formed over p-layers 43, a conductive reflector 60 instead of p-electrode 82 is formed over TCL layer 52. Then the whole structure is bonded to a conductive superstrate 70, and the original substrate 10 is removed and nanostructured nitride layer 1000 is exposed, by known methods such as laser lift-off, chemical etching, wafer lapping/polishing, and ion-coupled plasma (ICP) etching. Finally, another TCL layer 51 is formed on the exposed nanostructured nitride layer 1000 with a cathode contact 81 formed over layer 51. According to the embodiment shown in FIG. 4, nanostructured nitride layer 1000 is positioned in direct contact with active-region 30 and, thus, light-emitting surface may function as photonic crystal for improved light extraction efficiency.

According to another aspect of the present invention, nanostructured nitride layer 1000 can also benefit UV and deep UV light-emitting devices formed on GaN templates. In the UV and deep UV embodiments of the present invention, AlGaN based active-regions are adopted. Nanostructure nitride layer 1000 can be used to transfer the high-quality crystal structure of GaN template to the AlGaN active-region, yet eliminating or significantly reducing in-plane lattice mismatch for AlGaN layers formed over GaN template layers.

Figure 5:
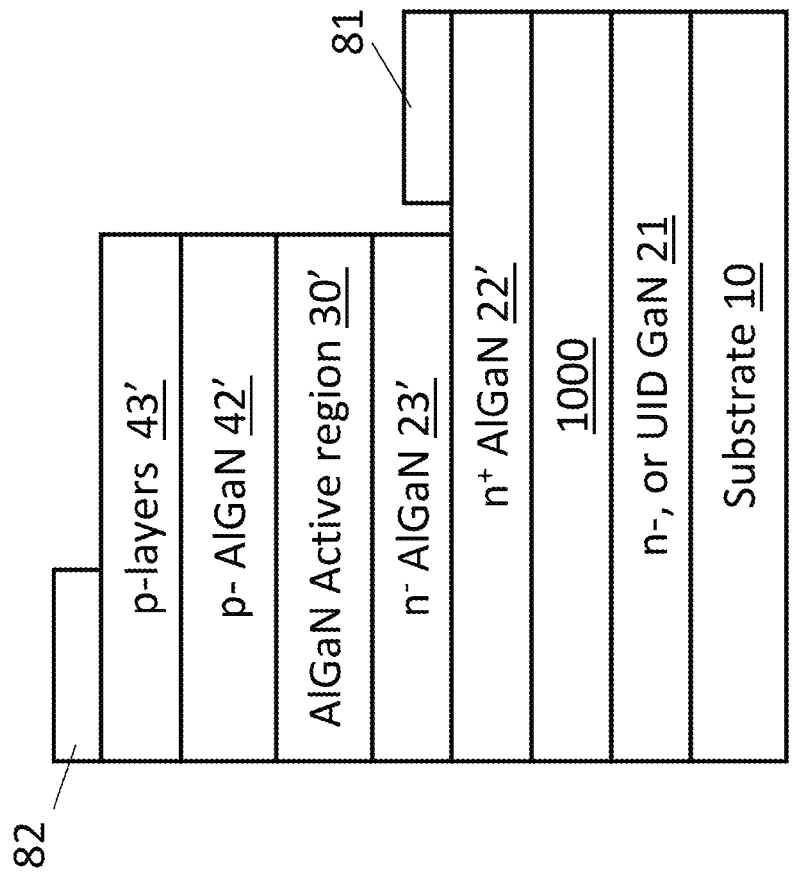
FIG. 5 illustrates the layered structure of a UV LED embodiment according to one aspect of the present invention.
Figure 6:
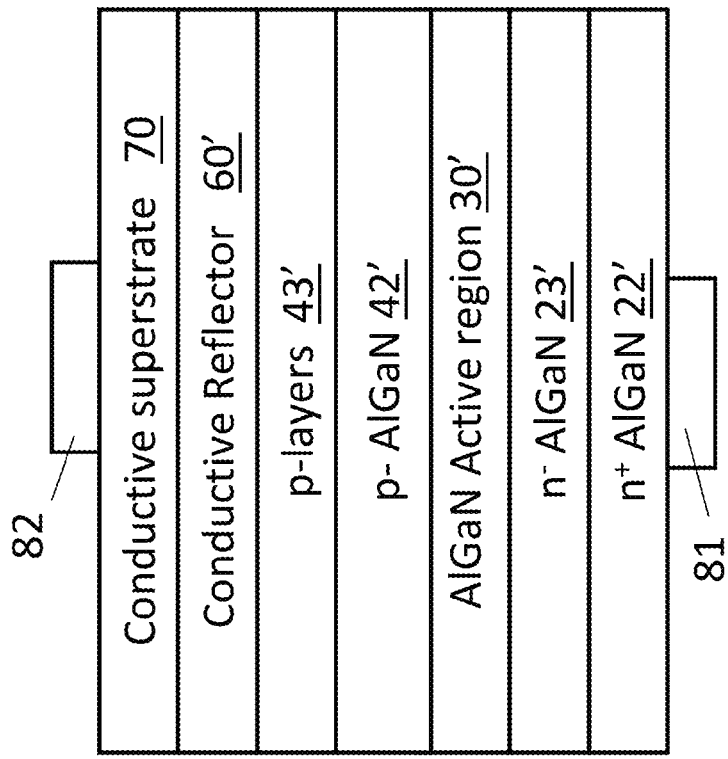
FIG. 6 illustrates the layered structure of a vertical thin-film UV LED embodiment according to one aspect of the present invention.

Two embodiments of light-emitting device such as LED, a lateral LED and a vertical thin-film LED, according to this aspect of the present invention are illustratively shown in FIG. 5 and FIG. 6, respectively.

Shown in FIG. 5, an AlGaN based UV or deep UV light-emitting structure is formed on a GaN template layer 21 made of n-GaN or UID-GaN, which in turn is formed over substrate 10. Substrate 10 can be sapphire, Si, GaN, AlN, SiC, GaAs and the like. A nanostructured nitride layer 1000 made of GaN or other suitable material such as AlGaN is formed on the GaN template layer 21. The UV or deep UV light-emitting structure may comprise a heavily n-type doped n$^+$-AlGaN layer 22', a lightly doped n$^-$-AlGaN layer 23', an AlGaN containing active-region 30', a p-type AlGaN 42', and some other optional p-type layers 43'. The heavily n-type doped n$^+$-AlGaN layer 22' is formed on nanostructured nitride layer 1000. The p-type layers 43' may contain p-AlGaN and p-GaN, and p-InGaN layers. Active-region 30' is preferred to be of AlGaN/AlGaN MQW structure, but it can also contain only one AlGaN quantum well layer with necessary quantum barrier layers. The AlGaN composition of the quantum wells in the MQW can be deduced from the desired emission wavelength. For example, for a 340 nm light emission, the Al-content in the AlGaN quantum wells can be from 0-10%;

for a 310 nm light emission, Al-content in the AlGaN quantum wells can be from 14%-25%;

for a 280 nm light emission, Al-content in the AlGaN quantum wells can be from 30%-42%;

for a 265 nm light emission, Al-content in the AlGaN quantum wells can be from 40%-52%;

for a 240 nm light emission, Al-content in the AlGaN quantum wells can be from 53%-68%;

whereas the Al-content of the respective AlGaN quantum barriers is selected to ensure that the quantum barrier-quantum well bandgap offset to be at least 200 meV, such as at least 300 meV, at least 400 meV, or at least 500 meV, preferably to be at least 400 meV;

whereas the Al-contents of the layers 23', 22' and 42' are selected to ensure these AlGaN layers to have a bandgap offset with the respective AlGaN quantum barriers to be at least 0 meV, such as at least 50 meV, at least 100 meV, or at least 150 meV. Further, the AlGaN quantum barrier layer in the active region 30' is preferred to be of a thickness at least 6 nm, or at least 10 nm, or at least 12 nm, or at least 15 nm, for example in the range of 6-20 nm.

The AlGaN quantum well layer in the active region 30' is preferred to be of a thickness at least 1 nm, or at least 1.5 nm, or at least 2 nm, or at least 2.5 nm, or at least 3.0 nm, for example in the range of 1-3 nm.

The high-quality high efficiency UV or deep UV light-emitting structure is enabled on GaN template layer 21 by the nanostructured nitride layer 1000. The nanovoid surface filling factor of the nanostructured nitride layer 1000 is preferably to be greater than 4%, for example, in-between 5% to 10%. The UV or deep UV light-emitting device according to the embodiment shown in FIG. 5 emits light through the top p-layers 43'.

The embodiment shown in FIG. 5 can be further converted into a vertical thin-film light-emitting device, as shown in FIG. 6. The fabrication of vertical thin-film light-emitting device is known in the prior art and is discussed in connection with the embodiment shown in FIG. 4 in the previous context. As shown in FIG. 6, nanostructured nitride layer 1000 is removed to expose the n$^+$-AlGaN layer 22' for cathode electrode 81. The UV or deep UV light-emitting device according to the embodiment shown in FIG. 6 emits light through n$^+$-AlGaN layer 22'. An optional nanostructured nitride layer 1000 (not shown) can be formed right below and adjacent to the AlGaN active region 30' in the structure shown in FIG. 6.

The nanostructured nitride layer 1000 can also be used to relieve the mismatches of lattice and thermal expansion coefficient (TEC) for nitride based LED structures grown on Si substrate. For (0001) GaN layer formed on (111) Si substrate, the in-plane lattice mismatch is as high as −16.95%. This results in large tensile strain leading to film cracking for GaN epitaxy growth on Si substrate. To make things worse, further, there is a large in-plane mismatch of the thermal expansion coefficient ($5.6 \times 10^{-6}$ K$^{-1}$ for GaN and $2.6 \times 10^{-6}$ K$^{-1}$ for Si), which leads to further cracking in the GaN layer when cooling from the growth temperature to room temperature.

A further aspect of the present invention provides a light-emitting device and LED structure on Si substrate, wherein the Si substrate is preferably (111)-oriented, or (110)-oriented, or (100)-oriented. Shown in FIG. 10 is the illustrative layered structure of a light-emitting device embodiment formed on Si substrate 11. Between Si substrate 11 and layer 21, optionally there are a few transition layers made of AlN and/or AlGaN (not shown in FIG. 10). In-between layer 21 and nitride layer 22 there is a nanostructured nitride layer 1000(2). Layer 21 can be made of unintentionally doped (UID) or Si-doped GaN with a thickness ranging from 500 nm to 5000 nm. Here layer 21 serves as a template layer. Layer 22 for current spreading can be Si-doped GaN with doping level, for example, up to $2 \times 10^{19}$ cm$^{-3}$, with a thickness, for example, up to 3000 nm. Layer 22 is followed by a lightly doped GaN layer 23 with Si-doping in the $1\text{-}8 \times 10^{17}$ cm$^{-3}$ range. Nanostructured layer 1000(2) may be inserted for more than once, for example, for m times, where m equal to 1, 2, 3, 4, 5, et al. This means that layer 21 and nanostructured layer 1000(2) can be repeatedly formed on each other for several times. In other words, here the nanostructured nitride layer 1000(2) comprises a plurality of nanostructured nitride sub-layers; layer 21 or in general a template layer comprises a plurality of sub-layers, and the nanostructured nitride sub-layers and the sub-layers of the template layer are alternately stacked on top of each other. Each of the nanostructured nitride sub-layers may have similar or different thickness, nanovoid surface filing factor, nanovoid density, and finishing lateral dimension within the range as discussed above in connection with individual nanostructured nitride layer.

The function of nanostructured layer(s) 1000(2) is to accommodate the in-plane lattice and thermal expansion coefficient mismatches of nitride layer 22 and Si substrate 11. For this purpose, the nanovoid surface filling factor of nanostructured nitride layer 1000(2) can be selected to be in the range of 4%-50% or 30%-50%.

Also shown in FIG. 10 there is another nanostructured nitride layer 1000(1) placed right beneath and adjacent to active-region 30. The nanovoid surface filling factor of nanostructured nitride layer 1000(1) is chosen according to active-region light emission wavelengths, as set forth in the previous embodiments. Light-emitting devices on Si substrate according to this aspect of the present invention are substantially crack-free or crack-reducing, and possess lower device operation voltage and higher internal and external quantum efficiencies.

It is noted that even though as shown in FIG. 10 the embodiment is for visible light-emitting devices, it is understood that from FIG. 10, FIG. 5, FIG. 6 and the previous teachings, UV and deep UV light-emitting devices formed on Si substrate with the aid of a nanostructured nitride layer are also achievable according to the present invention. It is further understood that referring to FIG. 4 and FIG. 6, the embodiment shown in FIG. 10 can also be converted into vertical thin-film visible and/or UV light-emitting devices.

In all of the embodiments discussed above in connection with FIGS. 2-6 and 10, the nanostructured nitride layer 1000 (1000(1) and 1000(2) in FIG. 10) can be made of group III nitride $Al_xIn_yGa_{1-x-y}N$ with $0.1 \geq x \geq 0$ and $0.1 \geq y \geq 0$, or $1 \geq x \geq 0.5$ and $0.1 \geq y \geq 0$, such as $Al_xGa_{1-x}N$, or $In_yGa_{1-y}N$, with a specific example being GaN or AlN. Nanostructured nitride layer 1000 can be a single layer with uniform or varying composition and doping, or multiple layers each with different compositions and doping. The thickness, t, of nanostructured nitride layer 1000 can be in the range of 50-1000 nm, for example 100-550 nm.

The application of the nanostructured nitride layer 1000 is not limited to the light-emitting or LED structures discussed in the above embodiments. The nanostructured nitride layer can be combined into any conventional light-emitting or LED structures such as a III nitride light-emitting device or LED, or II-VI light-emitting device or LED. The nanostructured nitride layer can be provided right below and adjacent to the active region, or on a substrate, or a template layer away from the active region in a similar manner discussed above. Nanostructured nitride layer can also be combined into any conventional electronic devices wherein large lattice mismatches need to be addressed between different structure layers.

In addition to being formed via epitaxial growth as discussed above, optionally, nanostructured nitride layer 1000 in principal can also be formed via other nanofabrication process such as nanoimprint and nanolithography process. An example of nanoimprint and nanolithography can be found in U.S. Pat. No. 7,419,764 which is incorporated herein by reference in its entirety.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is claimed is:

1. A light emitting device comprising:
an n-type layer;
a p-type layer;
an active region sandwiched between the n-type layer and the p-type layer; and
a continuous nanostructured layer with nanovoids formed therein, the nanovoids having openings exposed to an upper surface of the continuous nanostructured layer on which upper surface a subsequent layer is to grow, wherein the continuous nanostructured layer has a thickness in the range of 50-1000 nm, a nanovoid surface filling factor of the nanostructured continuous layer is in the range of 4%-50%, and the nanovoids have a finishing lateral dimension in the range of 50-500 nm and a depth in the range of 20-550 nm, and
wherein the n-type layer is sandwiched between the continuous nanostructured layer and the active region, or the continuous nanostructured layer is sandwiched between the n-type layer and the active region and in direct contact with the active region.

2. The light emitting device according to claim 1, comprising another nanostructured layer with nanovoids, the nanovoids having openings exposed to an upper surface of the another nanostructured layer on which upper surface a subsequent layer is to grow,
wherein the continuous nanostructured layer is sandwiched between the n-type layer and the active region and in direct contact with the active region, and the n-type layer is sandwiched between the continuous nanostructured layer and the another nanostructured layer, or
wherein the another nanostructured layer is sandwiched between the n-type layer and the active region and in direct contact with the active region, and the n-type layer is sandwiched between the another nanostructured layer and the continuous nanostructured layer.

3. The light emitting device according to claim 1, wherein the light emitting device is III-nitride light emitting device, the continuous nanostructured layer is a nanostructured nitride layer made of $Al_xIn_yGa_{1-x-y}N$, or $In_yGa_{1-y}N$, or $Al_xGa_{1-x}N$ with $0.1 \geq x \geq 0$ and $0.1 \geq y \geq 0$, or $1 \geq x \geq 0.5$ and $0.1 \geq y \geq 0$.

4. The light emitting device according to claim 3, wherein the nanostructured nitride layer is made of GaN or AlN.

5. The light emitting device according to claim 1, wherein the light emitting device is II-VI light emitting device, the continuous nanostructured layer is a nanostructured II-VI layer made of ZnO, ZnS, ZnSe, ZnTe, CdO, CdS, CdSe, or CdTe.

6. The light emitting device according to claim 1, wherein the nanovoids have a larger cross section on the upper surface of the continuous nanostructured layer than that on a lower surface of the continuous nanostructured layer, and there is an inclined angle α between sidewall surface of the nanovoids and the lower surface of the continuous nanostructured layer.

7. The light emitting device according to claim 1, wherein an angle β between a sidewall surface of the nanovoids and the upper surface of the continuous nanostructured layer is in the range of 90-155 degree.

8. The light emitting device according to claim 1, wherein the continuous nanostructured layer is a nanostructured nitride layer sandwiched between the n-type layer and the active region and in direct contact with the active region, and the active region is a III-nitride active region comprising at least one InGaN quantum well, wherein:
the at least one InGaN quantum well is configured for emitting UV-purple light (λ=380 nm to 430 nm), and the nanostructured nitride layer has a nanovoid surface filling factor not less than 4%, or
the at least one InGaN quantum well is configured for emitting blue-cyan light (λ=430 nm to 500 nm), and the nanostructured nitride layer has a nanovoid surface filling factor not less than 6%, or
the at least one InGaN quantum well is configured for emitting green-yellow light (λ=500 nm to 580 nm), and the nanostructured nitride layer has a nanovoid surface filling factor not less than 12%, or
the at least one quantum well is configured for emitting amber-red light (λ=580 nm to 630 nm and above), and the nanostructured nitride layer has a nanovoid surface filling factor not less than 20%.

9. The light emitting device according to claim 1, wherein the continuous nanostructured layer is a nanostructured nitride layer sandwiched between the n-type layer and the active region and in direct contact with the active region, and the active region is a III-nitride active region comprising an AlGaN quantum well for emitting UV light (λ=240 nm to 380 nm).

10. The light emitting device according to claim 1, comprising a (111)-oriented, or (110)-oriented, or (100)-oriented Si substrate over which the nanostructured layer is formed, wherein the continuous nanostructured layer is a nanostructured nitride layer, and a current spreading layer comprising Si-doped GaN is formed over the nanostructured nitride layer and the active region is formed over the current spreading layer.

11. The light emitting device according to claim 1, comprising another nanostructured nitride layer positioned below and adjacent to the active region, wherein the another nanostructured nitride layer has a nanovoid surface filling factor in-between 4% to 50%.

12. The light emitting device according to claim 1, wherein the continuous nanostructured layer comprises a plurality of nanostructured nitride sub-layers and the n-type layer comprises a plurality of n-type sub-layers, and wherein the nanostructured nitride sub-layers and the n-type sub-layers are alternately formed on top of each other.

13. The light emitting device according to claim 1, wherein the continuous nanostructured layer is formed on a template layer which is formed on a substrate, the continuous nanostructured layer comprises a plurality of nanostructured nitride sub-layers and the template layer comprises a plurality of template sub-layers, and wherein the nanostructured nitride sub-layers and the template sub-layers are alternately formed on top of each other.

14. A light emitting device comprising:
an active region comprising a quantum barrier layer and a quantum well layer formed on the quantum barrier layer, wherein the quantum well layer has a different inherent in-plane lattice constant than that of the quantum barrier layer; and
a first continuous nanostructured layer having a thickness in the range of 50-1000 nm and having nanovoids of a finishing lateral dimension in the range of 50-500 nm and a depth in the range of 20-550 nm, with a nanovoid surface filling factor not less than the absolute value of an in-plane unit cell mismatch, $\Omega$, for the quantum well layer formed on the quantum bather, and,
wherein $\Omega=(1=\gamma)^2 1-1$, where $\gamma$ is an in-plane lattice mismatch between the quantum bather layer and the quantum well layer coherently formed on the quantum bather layer, and
wherein the quantum barrier layer is directly formed on the first nanostructured layer.

15. The light emitting device of claim 14, wherein the active region is a nitride active region and the first continuous nanostructured layer is a nanostructured nitride layer.

16. The light emitting device of claim 14, wherein the active region is made of II-VI semiconductors and the first continuous nanostructured layer is a nanostructured II-VI layer.

17. The light emitting device of claim 14, comprising a (111)-oriented, or (110)-oriented, or (100)-oriented Si substrate, wherein the first continuous nanostructured layer is a nanostructured nitride layer formed over an n-type layer, and the n-type layer is formed over the Si substrate.

18. The light emitting device of claim 14, comprising a second nanostructured layer, a current spreading layer, and a lightly doped layer formed on the current spreading layer, wherein the current spreading layer is formed on the second nanostructured layer, and the first continuous nanostructured layer is formed over the lightly doped layer.

19. The light emitting device of claim 14, wherein the nanovoid surface filling factor is in the range of 4%-50%.

20. The light emitting device according to claim 17, wherein the continuous nanostructured layer comprises a plurality of nanostructured nitride sub-layers and the n-type layer comprises a plurality of n-type sub-layers, and wherein the nanostructured nitride sub-layers and the n-type sub-layers are alternately formed on top of each other.

21. A light emitting device comprising:
a template layer;
a current spreading layer having a different inherent in-plane lattice constant than that of the template layer and formed on the template layer;
an active region formed over the current spreading layer; and
a first continuous nanostructured layer having a thickness in the range of 50-1000 nm and having nanovoids of a finishing lateral dimension in the range of 50-500 nm and a depth in the range of 20-550 nm, with a nanovoid surface filling factor not less than the absolute value of an in-plane unit cell mismatch, Q, for the current spreading layer formed on the template layer, and,
wherein $\Omega=(1+\gamma)^2-1$, where $\gamma$ is an in-plane lattice mismatch between the template layer and the current spreading layer coherently formed on the template layer, and
wherein the template layer is directly formed on the first continuous nanostructured layer.

22. The light emitting device according to claim 21, wherein the first continuous nanostructured layer is formed on another template layer, the nanostructured layer comprises a plurality of nanostructured nitride sub-layers and the another template layer comprises a plurality of template sub-layers, and wherein the nanostructured nitride sub-layers and the template sub-layers are alternately formed on top of each other.

23. The light emitting device of claim 21, wherein the active region is a nitride active region and the first continuous nanostructured layer is a nanostructured nitride layer.

24. The light emitting device of claim 21, wherein the active region is made of II-VI semiconductors and the first continuous nanostructured layer is a nanostructured II-VI layer.

25. The light emitting device of claim 21, comprising a (111)-oriented, or (110)-oriented, or (100)-oriented Si substrate, wherein the first continuous nanostructured layer is a nanostructured nitride layer formed over an n-type layer, and the n-type layer is formed over the Si substrate.

26. The light emitting device of claim 21, comprising a second nanostructured layer, a second current spreading layer, and a lightly doped layer formed on the second current spreading layer, wherein the second current spreading layer is formed on the second nanostructured layer, and the first continuous nanostructured layer is formed over the lightly doped layer.

27. The light emitting device of claim 21, wherein the nanovoid surface filling factor is in the range of 4%-50%.

* * * * *